(12) United States Patent
Lim et al.

(10) Patent No.: US 7,939,348 B2
(45) Date of Patent: May 10, 2011

(54) E-BEAM INSPECTION STRUCTURE FOR LEAKAGE ANALYSIS

(75) Inventors: Victor Seng Keong Lim, Singapore (SG); Jeffrey Lam, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 284 days.

(21) Appl. No.: 11/845,787

(22) Filed: Aug. 28, 2007

(65) Prior Publication Data

US 2009/0057664 A1    Mar. 5, 2009

(51) Int. Cl.
*H01L 21/66* (2006.01)

(52) U.S. Cl. .................. 438/18; 438/14; 438/17; 257/48

(58) Field of Classification Search .................... 257/48; 438/14, 17, 18

See application file for complete search history.

(56) References Cited

U.S. PATENT DOCUMENTS

| | | | |
|---|---|---|---|
| 6,297,644 B1 * | 10/2001 | Jarvis et al. | 324/537 |
| 6,528,818 B1 * | 3/2003 | Satya et al. | 257/48 |
| 6,897,475 B2 * | 5/2005 | Wang | 257/48 |
| 2007/0051948 A1 * | 3/2007 | Fales et al. | 257/48 |
| 2007/0296447 A1 * | 12/2007 | Bae et al. | 324/765 |
| 2008/0237487 A1 * | 10/2008 | Pinto et al. | 250/492.1 |
| 2008/0246030 A1 * | 10/2008 | Satya et al. | 257/48 |
| 2008/0315196 A1 * | 12/2008 | Aghababazadeh et al. | 257/48 |

* cited by examiner

*Primary Examiner* — N Drew Richards
*Assistant Examiner* — Yu-Hsi Sun
(74) *Attorney, Agent, or Firm* — Horizon IP Pte Ltd

(57) ABSTRACT

A testing structure, and method of using the testing structure, where the testing structure comprised of at least one of eight test structures that exhibits a discernable defect characteristic upon voltage contrast scanning when it has at least one pre-determined structural defect. The eight test structures being: 1) having an Active Area (AA)/P-N junction leakage; 2) having an isolation region to ground; 3) having an AA/P-N junction and isolation region; 4) having a gate dielectric leakage and gate to isolation region to ground; 5) having a gate dielectric leakage through AA/P-N junction to ground leakage; 6) having a gate dielectric to ground and gate/one side isolation region leakage to ground; 7) having an oversized gate dielectric through AA/P-N junction to ground leakage; and 8) having an AA/P-N junction leakage gate dielectric leakage.

20 Claims, 15 Drawing Sheets

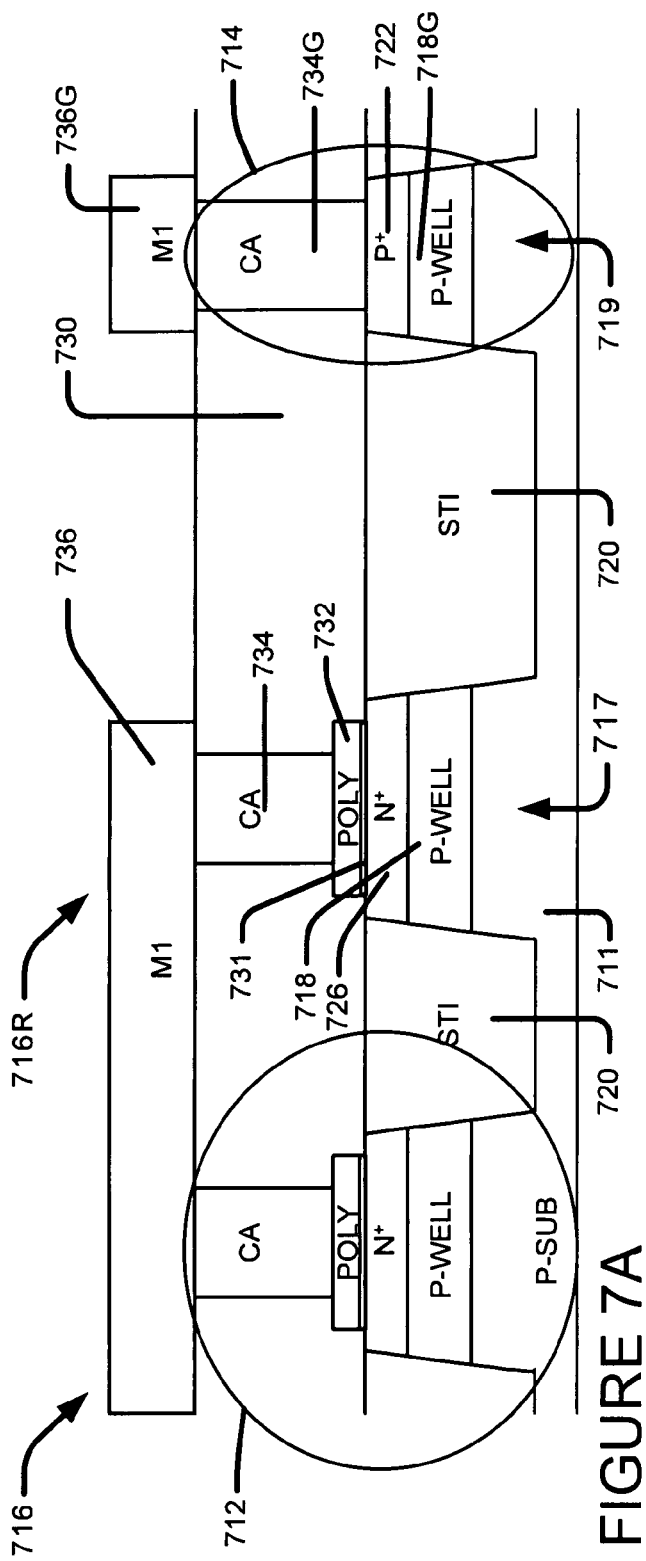
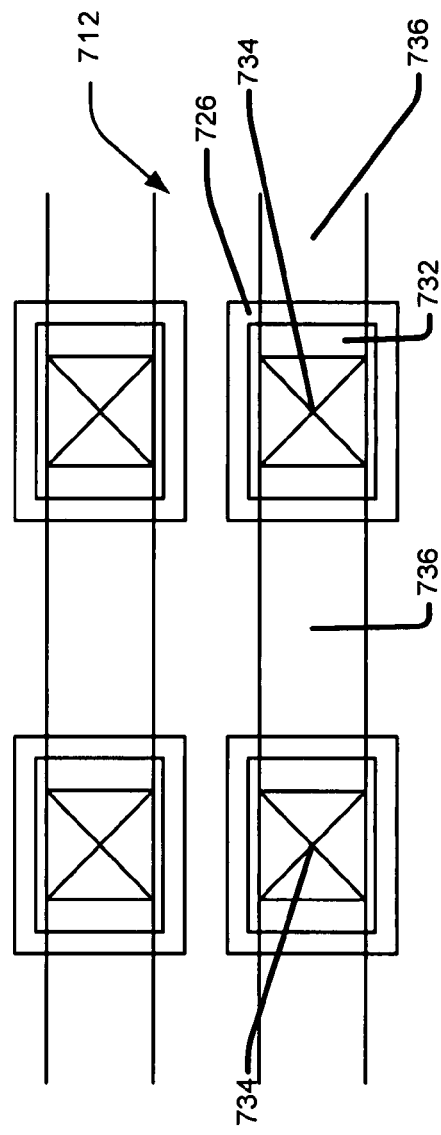
FIGURE 7A
FIGURE 7B

TEST STRUCTURES 116 THRU 816

US 7,939,348 B2

E-BEAM INSPECTION STRUCTURE FOR LEAKAGE ANALYSIS

FIELD OF THE INVENTION

This invention relates generally to a test structure and method for defect detection in a semiconductor structure and more particularly to a test structure and method for defect detection using voltage contrast test.

DESCRIPTION OF THE PRIOR ART

In the semiconductor integrated circuit (IC) industry, there is a continuing demand for higher circuit packing densities. This demand of increased packing densities has led the semiconductor industry to develop new materials and processes to achieve sub-micron device dimensions. Manufacturing ICs at such minute dimensions adds more complexity to circuits and the demand for improved methods to inspect integrated circuits in various stages of their manufacture is ever present.

Although inspection of such products at various stages of manufacture is very important and can significantly improve production yield and product reliability, the increased complexity of ICs increases the cost of such inspections, both in terms of expense and time. However, if a defect can be detected early in production, the cause of the defect can be determined and corrected before a significant number of defective ICs are manufactured.

In order to overcome the problems posed by defective ICs, IC manufacturers sometimes fabricate semiconductor defect test structures. Such defect test structures are dedicated to defect analysis. The defect test structures are fabricated such that they are sensitive to defects that occur in IC product, but are designed so that the presence of defects is more readily ascertained. Such defect test structures are often constructed on the same semiconductor substrate as the IC products.

Defect detecting systems frequently utilize charged particle beams. In such systems, a charged particle beam, such as an electron beam, is irradiated on defect test structures. The interaction of the electron beam with features in the circuitry generates a number of signals in varying intensities, such as secondary electrons, back-scattered electrons, x-rays, etc. Typically, electron beam methods employ secondary electron signals for the "voltage contrast" (VC) technique for circuit defect detection.

However, there is a need for improved methods and devices.

SUMMARY OF THE INVENTION

The exemplary embodiments of the present invention provide a structure and a method of employing a testing structure which is characterized as follows. The testing structure is comprised of at least one test structure. Each of the test structures exhibit(s) a discernable defect characteristic upon voltage contrast (VC) scanning when the test structure(s) that exhibits the discernable defect characteristic has at least one predetermined structural defect. The at least one test structure is selected from the following first through eighth exemplary test structures:

1) a first test structure having an Active Area (AA)/P-N junction leakage test structure;
2) a second test structure having an isolation region to ground test structure;
3) a third test structure having an AA/P-N junction and isolation region test structure;
4) a fourth test structure having a gate dielectric leakage and gate to isolation region to ground test structure;
5) a fifth test structure having a gate dielectric leakage through AA/P-N junction to ground leakage test structure;
6) a sixth test structure having a gate dielectric to ground and gate/one side isolation region leakage to ground test structure;
7) a seventh test structure having an oversized gate dielectric through AA/P-N junction to ground leakage test structure; and
8) an eighth test structure having an AA/P-N junction leakage gate dielectric leakage test structure.

It is noted that 1 or more, 2 or more, 3 or more, 4 or more, 5 or more, 6 or more, 7 or more or 8 or more different test structures may be employed. Additionally, more than one of the same test structure may also be employed, for example a first, fifth and two sixth test structures may be employed.

In yet another aspect of the invention, a method of forming ICs is disclosed. The method comprises providing a test structure which detects various types of leakage defects, the test structure capable of quantifying magnitude of leakage based on grey scale. The method further comprises differentiating killer leakage defects, determining a solution for the killer defects and fabricating ICs incorporating the solution.

The above and below advantages and features are of representative, exemplary, embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the teachings of the present invention and further details of a process of fabricating such a semiconductor device in accordance with the teachings of the present invention will be more clearly understood from the following description taken in conjunction with the accompanying drawings in which like reference numerals designate similar or corresponding elements, regions and portions and in which:

FIGS. 7A through 7C are cross sectional and overhead plan views illustrating a seventh test structure according to another exemplary embodiment of the present invention;

DETAILED DESCRIPTION OF THE EXAMPLE EMBODIMENTS

Figures 1A, 1B:
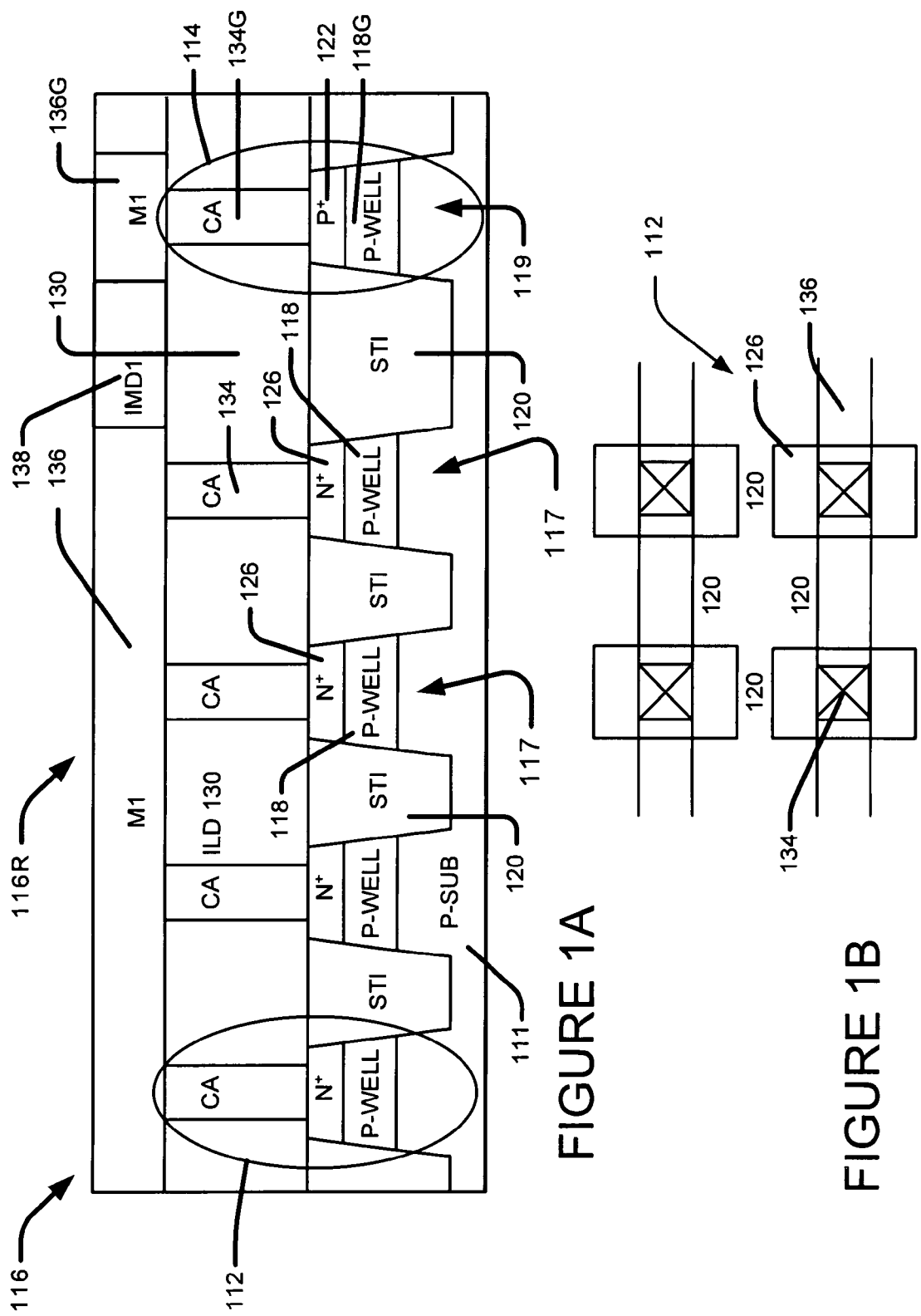
FIGS. 1A through 1E are cross sectional and overhead plan views illustrating a method for manufacturing the first test structure according to an exemplary embodiment of the present invention.

Reference will now be made in detail to example embodiments of the invention. Examples of these embodiments are illustrated in the accompanying drawings. While the invention will be described in conjunction with these nonlimiting example embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The exemplary embodiments may be practiced without some or all of these specific details. In other instances, well known process operations have not been described in detail in order not to unnecessarily obscure the present invention.

The example embodiments of the present invention will be described in detail with reference to the accompanying drawings. The example embodiments provide a test structure for voltage contrast (VC) and, optionally, electric testing and a method of forming a testing structure for a semiconductor structure.

It is noted that the element names may utilize "first" as an adjective for elements in the first test structure and "eighth" as an adjective for elements in the eighth test structure. The eighth poly region does not necessarily mean that there are a total of eight (8) poly regions. These element names do not necessarily mean that they are the number of, eighth poly region, but the poly region in the eighth test structure.

Note that the devices can be P type or N type and are not limited to the dopant types shown in the figures. For example, the P and N type devices shown in the exemplary Figures may be reversed, i.e., P type devices may be N type devices and N type devices may be P type devices.

Overview

The present invention relates to test structures for testing various types of defects in, for example, a device such as transistors. For example, the structures test for front end of line (FEOL) leakage issues related to silicon defects (e.g. Active Area or PN junction), isolation (e.g., shallow trench isolation or STI) defects and gate oxide defects (e.g., pin holes). The structures can also be used to test, for example, back end of line (BEOL) leakage issues. Structures which test for other leakage issues are also useful. In one embodiment, a plurality of test structures are provided. The test structures test for a single type of defect, multiple types of defects or a combination thereof.

The test structures may be tested using a voltage contrast (VC) test and an optional electric test. Leakage defects will manifest as VC defects. Using the test structures, leakage defects can be quantified or measured in terms of magnitude or grey scale level of the VC test. Killer defects can be easily differentiated from non-killer defects by, for example, correlating with ET (electrical test) spec or sort yield data. By effectively and efficiently identifying killer defects, solutions can be incorporated into the IC. This increases yields which result in reduced manufacturing costs.

Figure 8A:
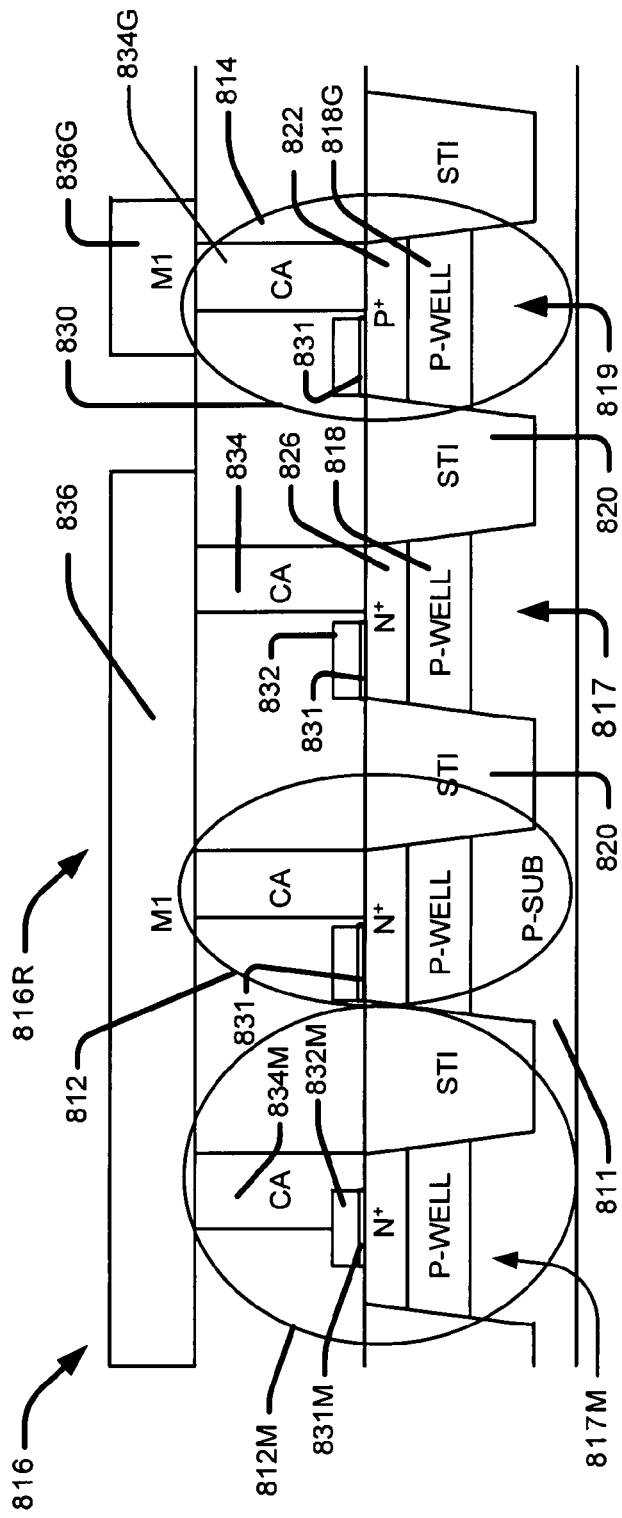
FIGS. 8A through 8C are cross sectional and overhead plan views illustrating an eighth test structure according to another exemplary embodiment of the present invention.
Figure 8B:
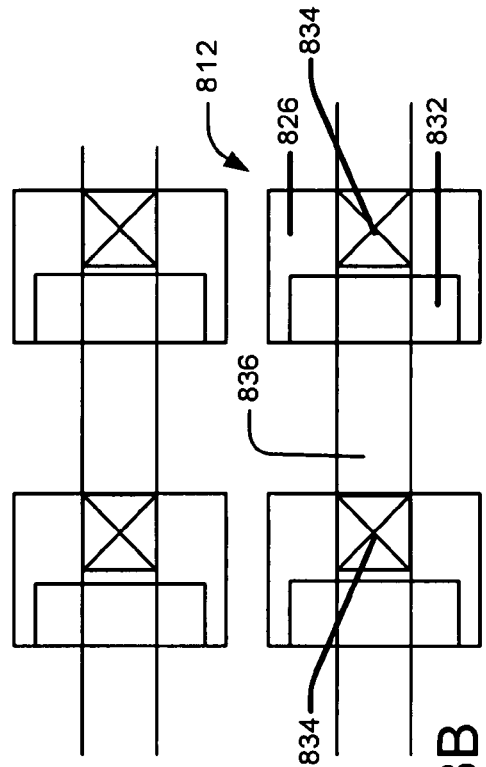
Figure 8C:
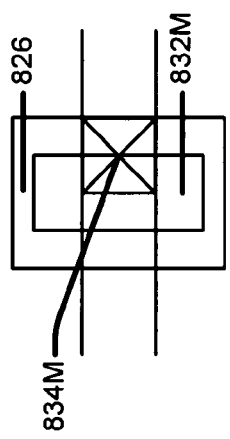
Figure 9A:
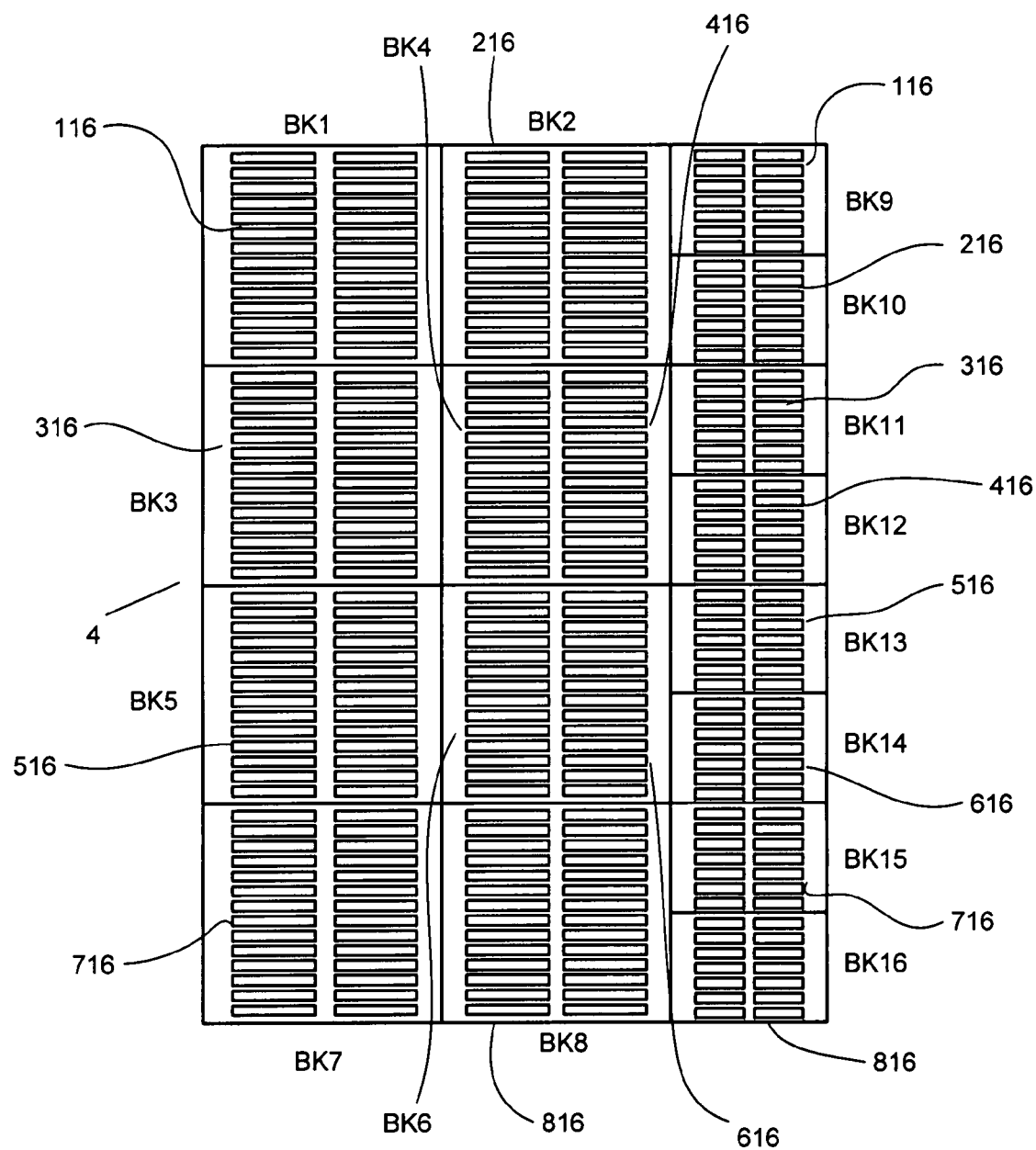
FIGS. 9A and 9B are overhead plan views illustrating an overall testing structure according to an exemplary embodiment of the present invention.

FIG. 9A shows an overall testing structure 4 in accordance with one embodiment of the invention. As shown, the testing structure comprises 16 blocks (BK1-BK16). A block comprises at least one of the exemplary test structures (116, 216, 316 ... 816) as described in FIGS. 1A to 8A. In one embodiment, BK1 and BK9 comprises test structure 116, BK2 and BK10 comprises test structure 216, BK3 and BK11 comprises test structure 316, BK4 and BK12 comprises test structure 416, BK5 and BK13 comprises test structure 516, BK6 and BK14 comprises test structure 616, BK7 and BK15 comprises test structure 716, and BK8 and BK16 comprises test structure 816. Other arrangements of test structures are also useful. For example, it is understood that the test structures (116, 216, ... 816) need not be located at or within a single testing structure 4 on a chip but may be dispersed about the chip.

The exemplary test structures may be tested using a VC (voltage contrast) test and an optional electric test. The testing of at least one of the test structures or with the testing of two or more of the test structures allowing us to correlate/isolate and determine the device part (e.g., Active Area (AA), isolation (iso), gate dielectric, etc.) of the test structure(s) that is defective. We can also more accurately determine which VC (voltage contrast) defects are "killer" defects, that are defects that will unacceptably degrade/affect the performance of the relevant structures. The VC testing is preferably performed after the contact plugs (e.g. contact plugs 134 of first test device 112 (BK1)) are formed and before the M1 layer (e.g. M1 layer 136 of first test device 112 (BK1)) as shown in FIG. 1A is formed.

We may perform an optional electric test on the test structures to get electrical test results. The electric test results and the VC test results may be correlated to obtain more accurate identification of VC defects that are "killer" defects. Once this correlation is achieved, one could just use subsequent VC test alone to determine whether defects/"killer" defects are present.

The exemplary test structures specifically disclosed in the instant invention have different connections between the respective contact plugs and the Active Areas (AA), poly pads and/or STIs, for example. The test structures may be tested using a voltage contrast (VC) test thru an automatic E-beam inspection, and an optional electrical test.

Overall testing structure 4 may be located in the kerf between chips, for example. Overall testing structure 4 may be used on a product wafer or on a monitor wafer, for example. The test structures are preferably made during the same manufacturing steps used to make product devices (such as FETs) in the chips.

Figure 9B:
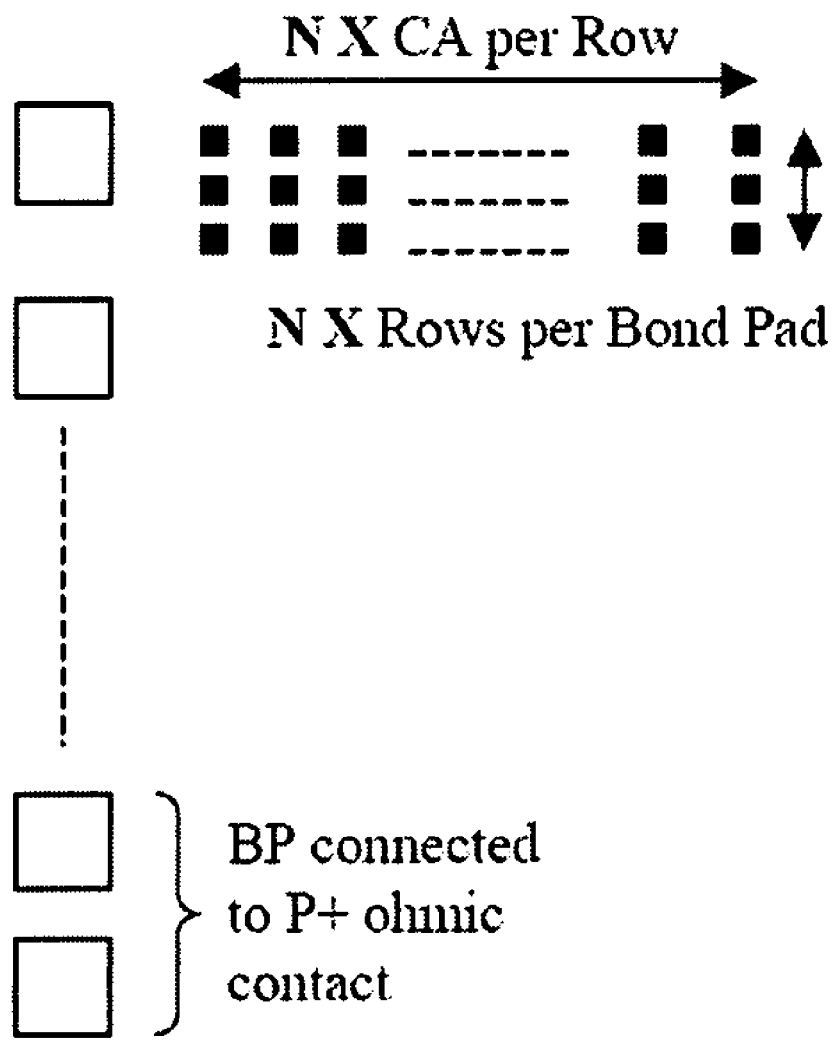

FIG. 9B is a schematic view representing the test structures within a block. The test structures can have N×CA (Contacts) per row (of test sites connected by a metal line M1). The test structures can have N times row (connected individual test sides connected by metal lines (e.g., M1) per bonding pad. Some of the bonding pads (BP) are connected to the p+ ohmic contact, e.g., 134G thru 834G structures (FIG. 1A to 8A).

Test methods may include, for example, voltage contrast inspection, optical inspections, basic particle size distribution, grounded electrical testing and non-grounded electrical testing. The exemplary test structures disclosed herein may be modified, as necessary, according to the test method employer.

An exemplary test method comprises the following:

Forming at least one (1) test structure on a substrate. The test structure may be comprised of any of the following exemplary test structures:

1) (FIG. 1A, for example) a first exemplary test structure 116 for testing Active Area (AA)/P-N junction leakage (which could be junction leakage or/and crystal (e.g. silicon) defect induced leakage) (AA/P-N Junction Leakage Structure);
2) (FIG. 2A, for example) a second exemplary test structure 216 for testing isolation (STI) region leakage (Isolation (STI) Region to Ground Test Structure);
3) (FIG. 3A, for example) a third exemplary test structure 316 for testing Active Area/P-N junction (which could be junction leakage or/and crystal (e.g. silicon) defect induced leakage) and isolation (STI) leakage, and may especially be STI interface and divot leakage (AA/P-N Junction and Isolation (STI) Region Test Structure);
4) (FIG. 4A, for example) a fourth exemplary test structure 416 for testing Active Area (AA)/P-N junction leakage, gate dielectric leakage and gate to isolation (STI) region leakage (Gate Dielectric Leakage and Gate to Isolation Region to Ground Test Structure);
5) (FIG. 5A, for example) a fifth exemplary test structure 516 for testing the gate dielectric to the Active Area/P-N junction leakage (Gate Dielectric Leakage Through AA/P-N Junction to Ground Leakage Test Structure) (related to the seventh, FIG. 7, structure);
6) (FIG. 6A, for example) a sixth exemplary test structure 616 for testing the gate dielectric to the Active Area and the isolation (STI) area leakage and the isolation (STI) region to the Active Area leakage (Gate Dielectric Leakage to Ground and Gate/One Side Isolation (STI) Region Leakage to Ground);
7) (FIG. 7A, for example) a seventh exemplary structure 716 for testing the oversized gate dielectric to the Active Area/P-N junction leakage (Oversized Gate Dielectric Leakage Through AA/P-N Junction to Ground Leakage Test Structure) (related to fifth, FIG. 5, structure); or
8) (FIG. 8A, for example) an eighth exemplary structure 816 for testing the Active Area/P-N junction leakage and the gate dielectric leakage (Active Area/P-N Junction Leakage and Gate Dielectric Leakage).

Please note that an Active Area (AA)/P-N junction test may also be referred to as simply "Active Area" or "AA," i.e., e.g., an Active Area VC test may also test the P-N junction. That is, for example, the Active Area may include a P-N junction (such as Active 117 shown in FIG. 1A, for example, may include the junction of P 118 and N 126). Active Area leakage may include crystal defect leakage and/or the P-N junction leakage.

We may scan the test structures with, for example, an electron beam to detect defects in the test structures and to obtain VC test results.

Optionally, after the VC test, we may e-test the test structure. We may use the e-test results to help us to correlate the BVC (Bright Voltage Contrast) defect that was detected by the, for example, EBI (Electron Beam Inspection) tool.

By testing the selected test structures we are able to identify and isolate electrical leakage issues related to STI defects, Active/junction defects, Gate oxide defects, etc. One advantage of the exemplary test structures of the present invention are that the combination of selected test structures/results enables one to decouple STI defects, Active/junction defects, Gate oxide defects, etc., and makes it easier to verify leakage issues at each of the test structures independently. All these test structures may be inspected on commercially available E-beam inspection systems (IBS) (e.g., eScan300/380 or eS31/32 . . . etc).

8 Exemplary Test Structures

The 8 exemplary test structures/sites will now be described in detail. All tables herein are at least partial listing of elements shown for the respective figures.

First Exemplary Test Structure 116—FIGS. 1A and 1B (AA/P-N Junction Leakage Test Structure)

Name: The Active Area/P-N Junction Leakage Test Structure.

FIG. 1A shows a cross sectional view of an exemplary first test structure 116. FIG. 1B shows a top down view of a portion of the first test structure. Below is a table of elements.

Figure 1C:
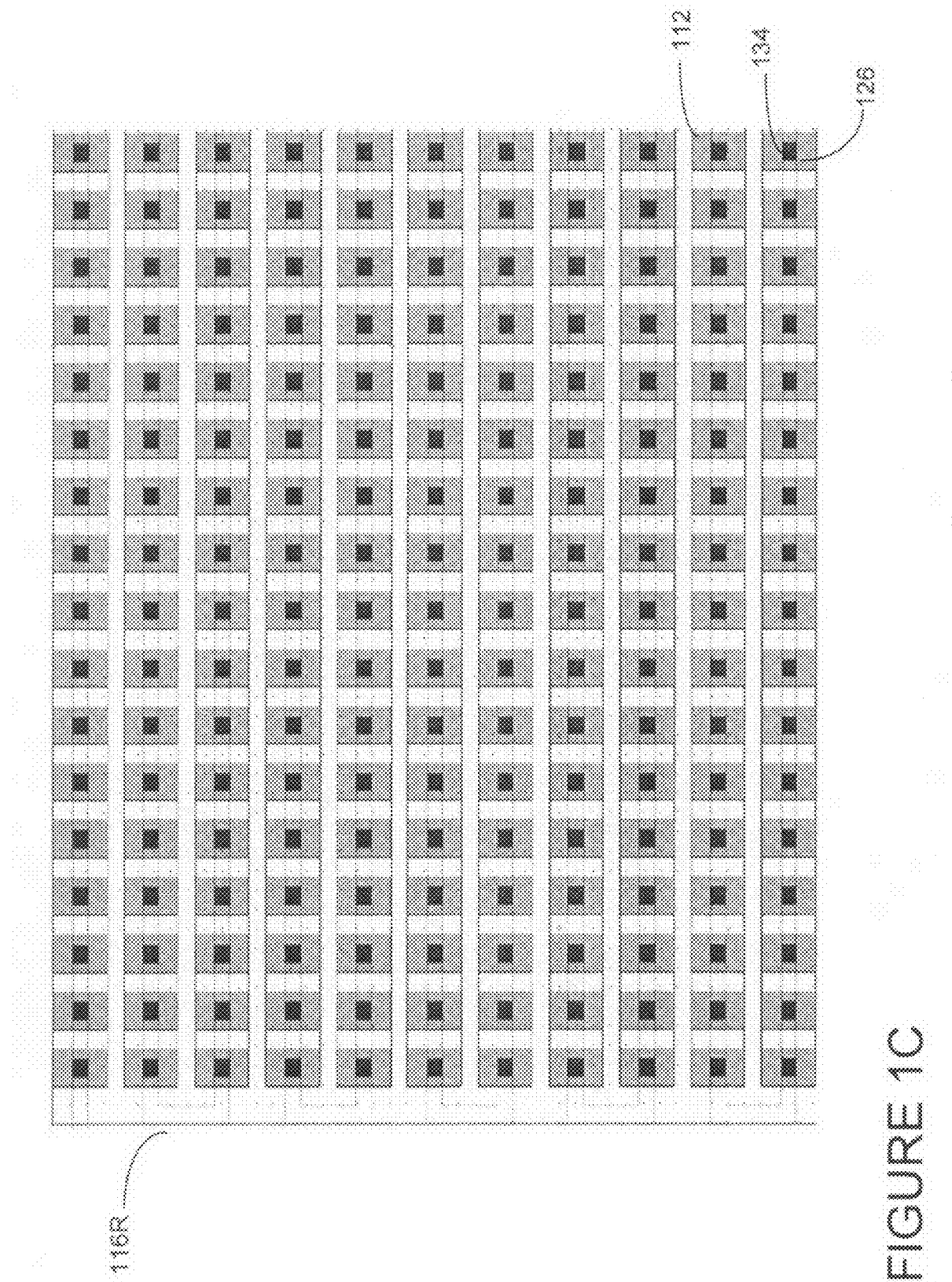

| $1^{st}$ test structure - element chart - FIGS. 1A, 1B and 1C | |
|---|---|
| number | Name |
| 116 | first test structure (site) |
| 116R | first test structure region |
| 112 | first test devices |
| 117 | a first Active Area |
| 111 | substrate |
| 120 | first isolation region |
| 118 | first well region |
| 126 | first doped region |
| 130 | dielectric layer (ILD layer) |
| 134 | a first contact (plug) |
| 136 | first conductive line |
| 138 | $1^{st}$ inter metal dielectric (IMD) layer |
| 136G | first conductive line (contacting the grounding contact (plug) 134G) |
| 114 | first grounding device |
| 119 | a first grounding Active Area |
| 118G | first grounding well region |
| 122 | first grounding doped region |
| 134G | first grounding contact (plug) |

As illustrated in FIG. 1A, for example, the first exemplary test structure (site) 116 is comprised of:

a plurality of first test devices 112 (e.g. including Active Area 117, contact 134, STI 120), in a first test structure region 116R on a substrate 111; and (Optional) at least a first conductive line 136 (M1) and (Optional) at least one first grounding device 114.

It is noted that first grounding device 114 may not be needed for the automatic VC. During the automatic EBI inspection, plug 134G of grounding device 114 lands upon P⁺ Active Area 122 so that grounding device 114 will show as bright voltage contrast (BVC) hence it cannot pick up any leakage defects (if there are any). A leakage defect can only be observed on a plug 134 that is landed on an N⁺ Active Area 126 where, under normal/good (i.e. defect free) conditions, such a leakage defect will show as a dark VC (voltage contrast).

First Test Device 112

The first test devices 112 are each comprised of:
⇨ a first Active Area 117 in a substrate 111 preferably surrounded by a first isolation region 120;
⇨ a first well region 118 in the first Active Area 117;
2) a first doped region 126 over the first well region 118; the first doped region 126 extending to the surface of the first Active Area 117; the first doped region 126 being of the opposite impurity type as the first well region 118 (for example, in FIG. 1A, an N+ first doped region 126 is over a first P-well region 118); and
a first contact (plug) 134 extending to the first Active Area 117 formed within a (n interlevel) dielectric layer 130.

The substrate 111 may be comprised of, for example, a semiconductor substrate such as, for example, a silicon substrate, a SOI substrate or an epi wafer.

The first doped region 126 may have a dopant concentration of, for example, between 1E13 and 1E20 atoms/cc. The first doped region 126 may be formed simultaneously in the same implant step as the product S/D (source/drain) regions.

The first contact plug 134 may be formed using, for example, a damascene process. The first contact plug 134 may be formed of, for example, tungsten (W) or any other suitable metallic material.

The test devices 112 are preferably formed during the same steps in which the product device(s) are formed. For example, the well regions 118, 118G in the test structures and product device are formed using the same well implant process. For example, the doped regions 126 can be formed along with the product S/D regions, etc.

We preferably VC test the test devices 112 after the contact plugs 134, 134G are formed. However VC testing on a metal interconnect (e.g. M1, M2) is still possible with slight modification of the metal routing pattern.

First Conductive Line 136 (M1)

The first conductive line 136 (M1) contacts the first contacts 134 of the test devices 112. The first grounding device 114 contacts the substrate 111. An inter metal dielectric (IMD1) layer 138 may be formed before or after the conductive line 136.

The contacts 134 and Active Areas 117 are preferably arranged in rows and columns. The conductive line runs along either a row or column. The conductive line 136 can connect one or more rows of contacts 134.

First Grounding Device 114.

Still referring to FIGS. 1A and 1B, for example, the first grounding device 114 can be comprised of:
a first grounding Active Area 119;
1) a first grounding well region 118G in the first contact Active Area 119;
2) a first grounding doped region 122 over the first grounding well region 118G. The first grounding doped region 122 extending to the surface of the first grounding Active Area 119; the first grounding doped region 122 having the same impurity type as the first grounding well region 118G. For example, in FIG. 1A, the P+ first grounding doped region 122 is over the first grounding P-well region 118G.
A first conductive grounding line 136G contacts the first grounding contact (plug) 134G. In the first, or other, test structure 116, the first devices 112 can be aligned in rows and columns as shown in FIG. 1B, for example.

FIG. 1C is a top down view showing an exemplary arrangement of test devices (for example test devices 112) lined up in rows and columns.

In a test structure 116, the first devices 112 may be aligned in rows and columns as shown, for example. In an example test structure 116, between 4100 and 5500 test devices 112 are in a row connected by the first conductive line 136 (see FIG. 1A, for example).

The first conductive line 136 (e.g., M1) connects the rows and columns. Between 200 and 300 rows (tgt=238 rows per pad) may be interconnected. Between about 2 to 6000 total first test devices 112 may be connected together by the first conductive line 136.

Figure 1D:
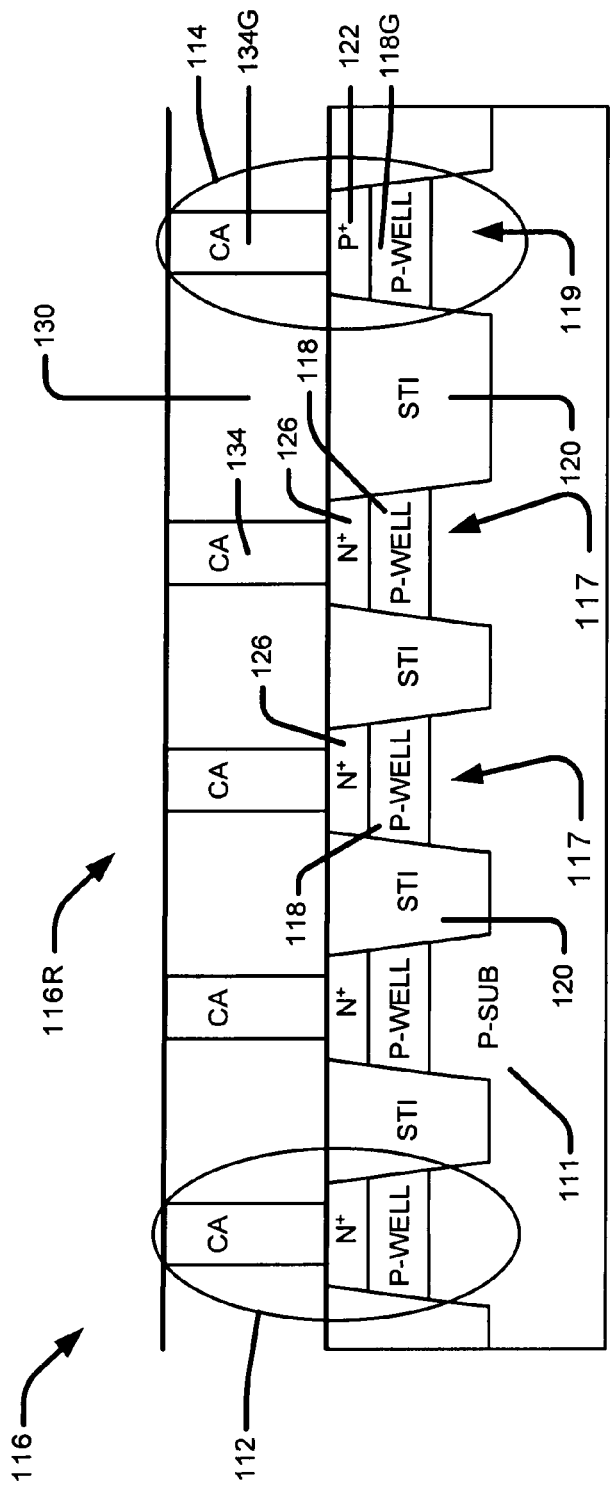

FIG. 1D shows a cross sectional view of the first exemplary test structure 116 at post contact (134, 134G) formation. At this point, the wafer can be examined using an EBI tool, for example, using a VC technique. It is preferable to test the wafer after formation of contacts 134 (134G) and before the M1 (136, 136G) and subsequent metal layers are formed.

Figure 1E:
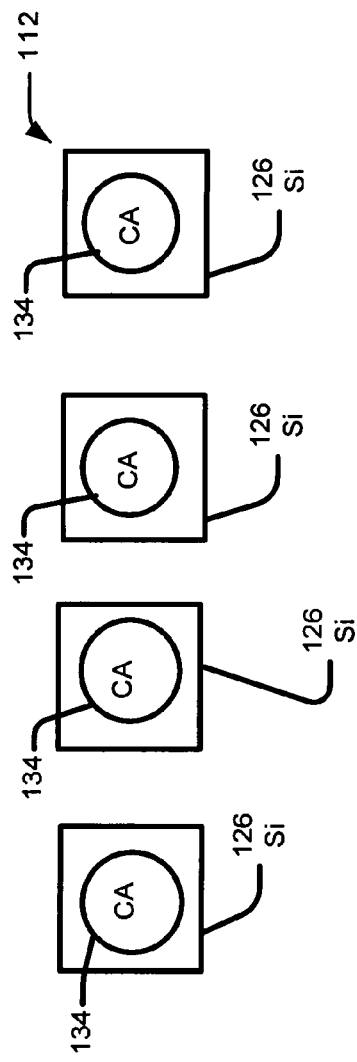

FIG. 1E is an incomplete top down view of the first test devices 112 (where CA=contact).

Referring to FIG. 9A (showing an exemplary overall testing structure (test site) 4) and 9B (and FIGS. 1A through 8C, for example), the difference between test blocks BK1 and BK9 (FIG. 9A) is simply how many rows and columns of the test structure are being connected together. Theoretically 1 pair of bond pads can have N (N≧1) number of single test structures in between them. It is important to know that BK1 & BK9, for example, are each an array of test structures 116 which are made up of repeating single test devices 112.

EBI inspection (e.g., VC testing) usually is being carried out after the polishing back of the contacts 134 (e.g. after the WCMP layer stage). This EBI inspection can help to determine any leakage thru each of the W-contacts 134. Generally an EBI inspection is very sensitive compared to E-testing. Hence the E-test current signal can be increased by cascading N number of single test structure in series.

Depending on specific requirements and needs, different numbers of test structures 116 can be cascaded in arrays to be tested electrically by E-testing after the M1 layer (136, 136G) is formed. This E-testing result may then be used for EBI leakage detection correlation.

First Exemplary Test Structure 116—FIGS. 1A to 1E

Name: AA (Active Area)/P-N Junction Leakage Structure

This first exemplary test structure 116 (FIG. 1D) is preferably used to test the leakage (using BVC and optionally electrical tests after M136, 136G formation) mainly on Si Active Area 117 and/or P-N junction leakage only. If there is any Si defect or P-N junction leakage current between 5 pA and 1 nA, it can be picked up by the W contact 134 connected to the Active Area 117 with the Si defect or the P-N 118, 126 junction leakage defect which manifests as a BVC (Bright Voltage Contrast) defect.

The first test structure 116 is preferably designed using minimum dimensions based on a particular design rule of a technology. We believe that leakage problems/issues are more pronounced at smaller dimensions.

The E-beam inspection (VC test) may be preferably performed after the M1 WCMP layers 136, 136G are formed (FIG. 1A). The E-beam inspection can also be performed after more metal and IMD layers are formed over the W contact plugs 134/M1 layers 136, 136G.

Figures 10A, 10B:
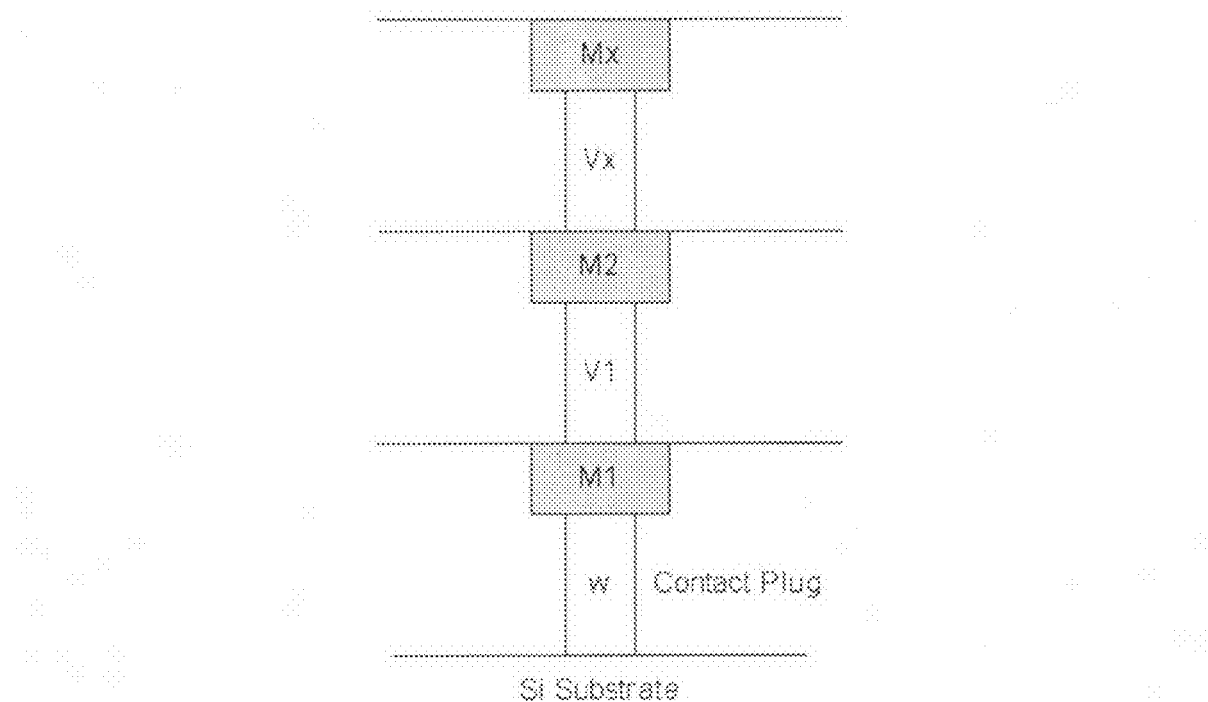
FIG. 10A is a table with descriptions of test conditions for a VC test in Extracting (+Ve) and Retarding (–Ve) modes.
FIG. 10B is a simplified cross sectional view illustrating a test structure according to an exemplary embodiment of the present invention.

FIG. 10B, for example, shows a simplified cross sectional drawing with a test structure having M1, M2 to Mx layers formed over a contact plug. However it is still possible to inspect the E-beam (VC test) structure at the M1 CMP (or any metal layer) if the contact plug(s) is (are) connected upward thru small rectangular metal blocks M1, M2 to Mx as shown in FIG. 10B, for example. This structure can be E-tested (electrically tested) after the M1 layer formation. That is, metal blocks M1, M2 to Mx are not substantially elongated in any direction.

For all the test structures (116 to 816, for example) we can either test the leakage at the WCMP contact 134 layer (highly recommended), e.g., the fabrication stage shown in FIG. 1D, or we can scan it at any metal layer by stacking up the metal layers M1, M2 to Mx as shown in FIG. 10B, for example, as electrically they are connected in series.

However for E-test correlation, it is important to join or connect several single test structures 116, 216, 316 . . . 816 together for an E-test to measure the leakage thru them.

VC (Voltage Contrast) or BVC (Bright Voltage Contrast) Test

In general, voltage contrast tests may involve radiating the test structures 116, 216, 316 . . . 816 with a primary beam of electrons, causing secondary radiation. The secondary radiation is measured and a voltage contrast image is formed.

Voltage contrast (VC) physics under Extracting mode (+Ve Mode) can have the following characteristics:
The Extraction field attracts the secondary electrons.
The grounded structure remains neutral, as the missing charges are replaced from ground.
The floating structure charges positively.
Secondary electrons from the floating structure are being extracted out from the surface by the external positive field. Hence the signal increases as more electrons make it to the detector.
These defects look dark.

Voltage contrast (VC) physics under Retarding mode (−Ve Mode) can have the following characteristics:
The Retarding field repels low energy secondary electrons.
The grounded structure remains neutral, as the excess repelled charges flow away to the ground.
The floating structure finds equilibrium with negative charges, boosting the energy of escaping secondary electrons.
These defects look bright as there are more electrons reaching the detector compared to the grounded structure(s).

FIG. 10A is a table with descriptions of the test conditions for the VC test in Extracting (+Ve) and Retarding (−Ve) modes. Here "RB" means reverse bias and "FB" means forward bias.

Electric Test—E-Test

Electrical tests (E-tests) are preferably performed on the test structure after the M1 layer 136, 136G is formed. The electrical tests may be conventional tests such as leakage and breakdown tests.

One key point may be that we are employing the E-test technique to help us in correlating the BVC (Bright Voltage Contrast) defect(s).

Generally an EBI inspection will generate a very high count of BVC defect density. While we had believed that most of the BVC defects were harmless, an acceptable method in the market to separate a real, or killer, BVC defect from a non-killer BVC defect is currently not available.

The main advantage of this BVC defect correlation is that we can easily identify which BVC defect(s) are killer leakage defect(s) and those which are not. For example, thru E-test confirmation, we may determine which Block, e.g., test structure 116, 216, 316 . . . 816, has a high leakage current.

EBI (VC) data may be measured using Grey Level Value (GLV), i.e., from 0 (Darkest) to 255 (Brightest). The GLV number is proportional to the magnitude of the leakage. For leakage analysis, we are expecting the GLV number to be in a range of from about 100 to 255, the higher the GLV the more "leaky" it is, and thus, the more possible it is a killer leakage defect. On top of this GLV value from the EBI tool, for example, we may correlate this data with E-test data at the M1 E-Test as we will know exactly where, and how many, BVC defects are on particular structures on a wafer.

Example: Assuming that we have 2 BVC defects with respective GLVs of 120 and 180. If M1 E-Test (ET) data shows that for a GLV=180, the BVC results in an ET current out of spec, while for a GLV=120, the BVC results in an ET current within spec. Thus, from the ET data we can confirm that any GLV>180 is a killer BVC defect.

Figures 2A, 2B:
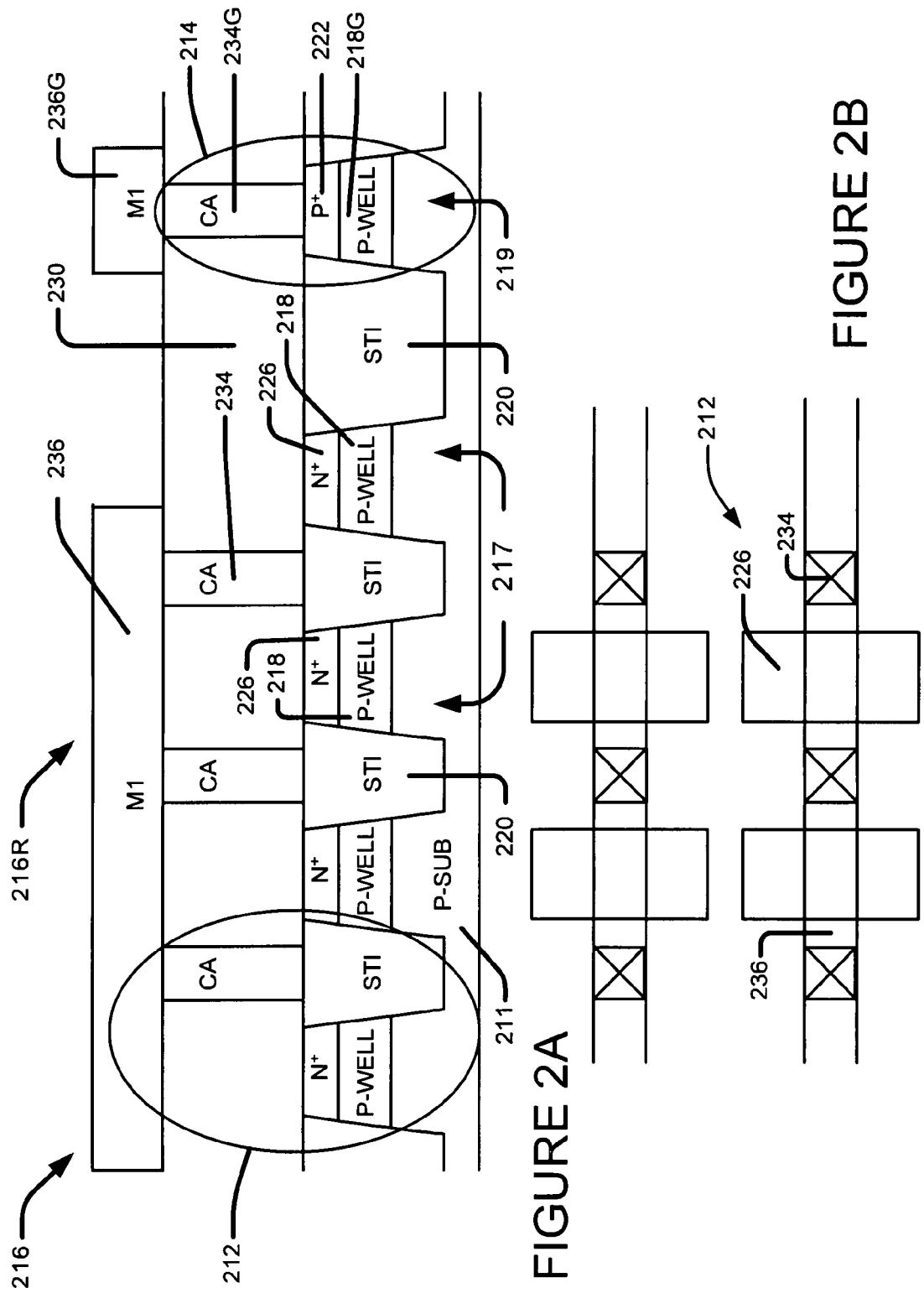
FIGS. 2A through 2C are cross sectional and overhead plan views illustrating a second test structure according to another exemplary embodiment of the present invention.

Second Exemplary Test Structure 216—FIGS. 2A and 2B
Name: The Isolation (STI) Region to Ground Test Structure 216.

FIGS. 2A and 2B show the second exemplary test structure 216. Corresponding analogous elements are shown as described above for first test structure 116. The corresponding elements are increased by 100, i.e. to the 200 series. The corresponding elements are also changed from "first" to "second" as appropriate. FIG. 2B is a partial overhead view of FIG. 2A.

In the second test structure 216, contact 234 contacts just the isolation (shallow trench isolation (STI)) 220.

The second test structure 216 is used to test for leakage of the isolation (STI) 220. The leakage tested is between the contact 234 and substrate 211.

Figure 2C:
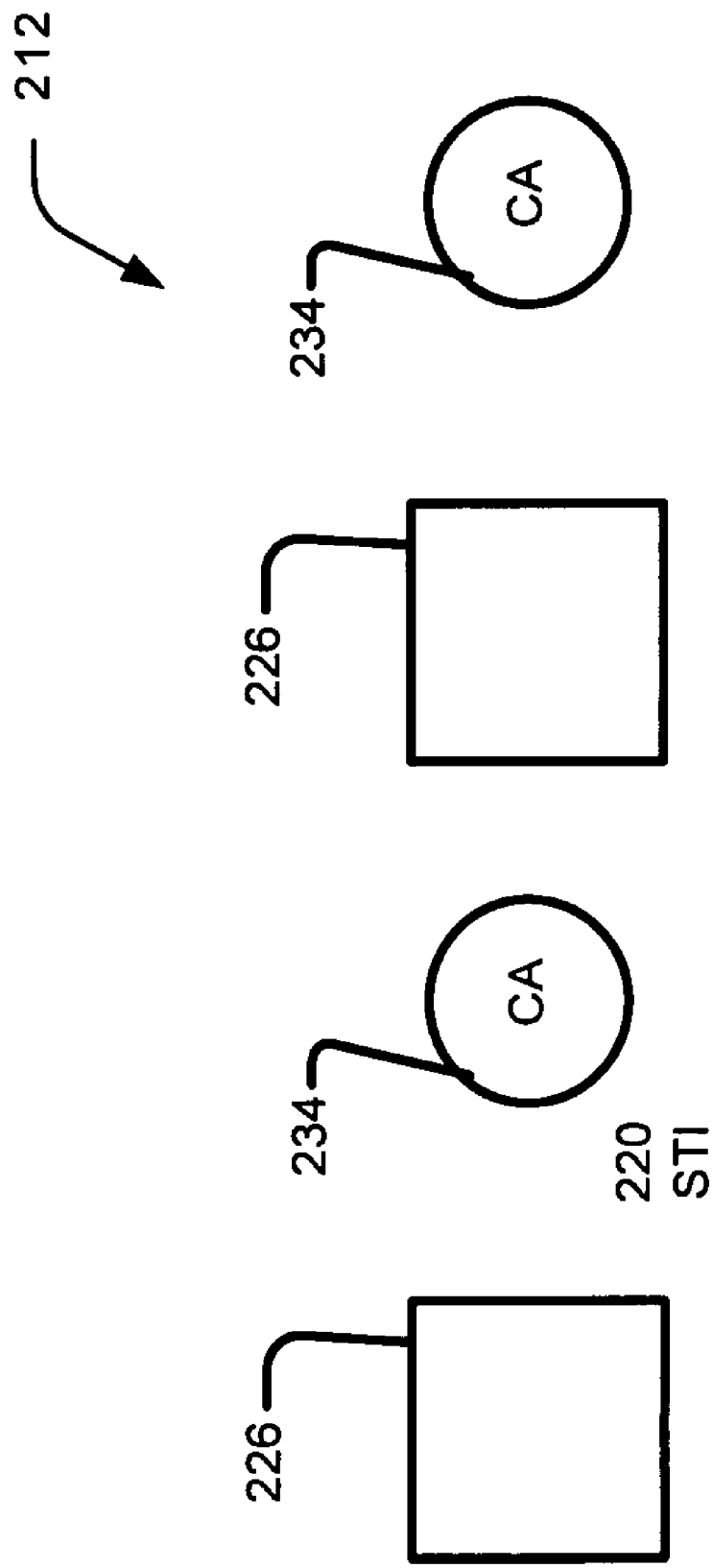

FIG. 2C shows another exemplary partial top down view of FIG. 2A.

| 2nd test structure - element chart - FIGS. 2A, 2B and 2C | |
|---|---|
| number | Name |
| 216 | second test structure (site) |
| 216R | second test structure region |
| 212 | second test devices |
| 217 | a second Active Area |
| 211 | substrate |
| 220 | second isolation region |
| 218 | second well region |
| 226 | second doped region |
| 230 | dielectric layer (ILD layer) |
| 234 | a second contact (plug) |
| 236 | second conductive line |
| (Not shown) | 1$^{st}$ inter metal dielectric (IMD) layer |
| 236G | second conductive line (contacting the grounding contact (plug) 234G) |
| 214 | second grounding device |
| 219 | a second grounding Active Area |
| 218G | second grounding well region |
| 222 | second grounding doped region |
| 234G | a second conductive grounding contact (plug) |

Figures 3A, 3B:
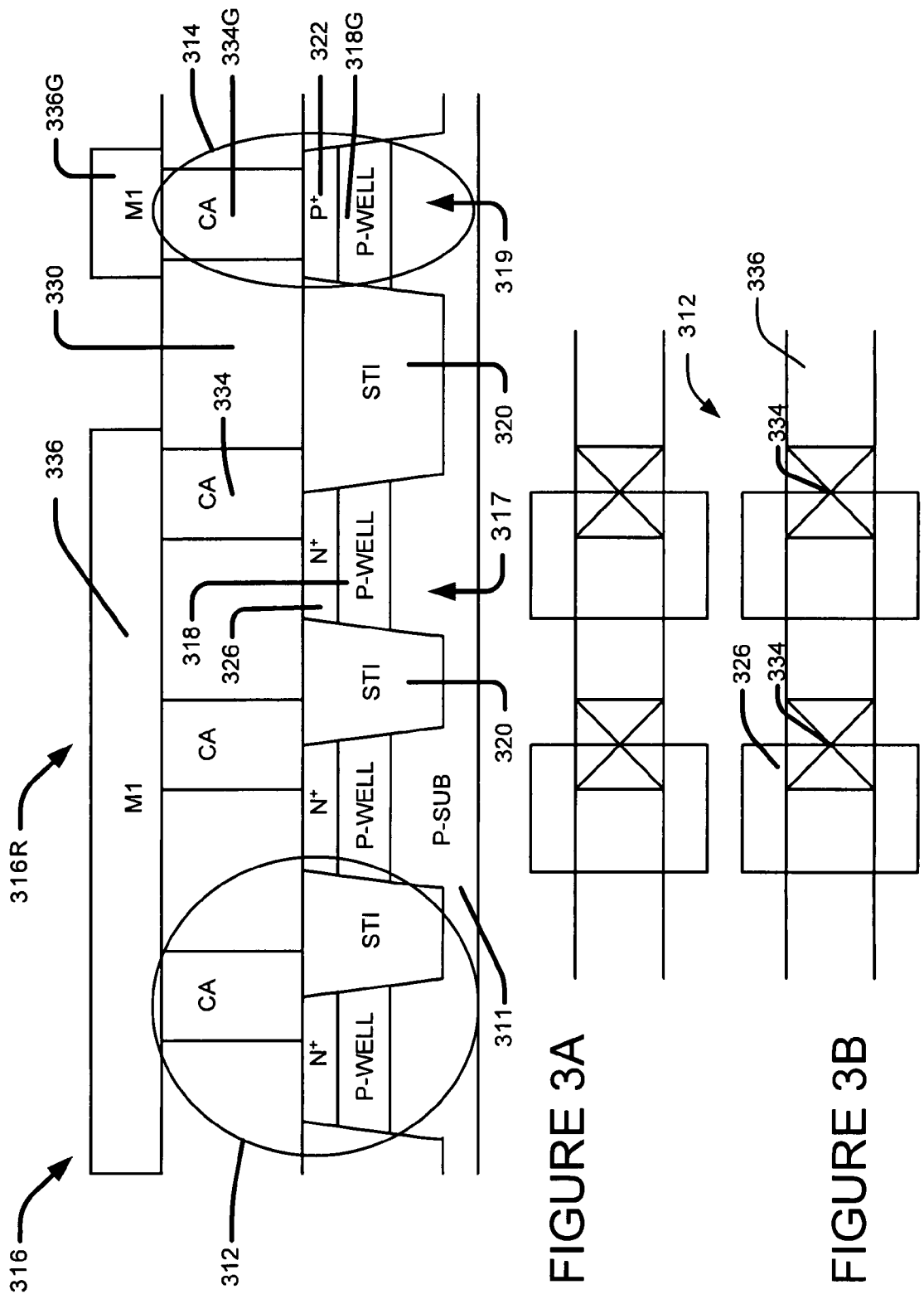
FIGS. 3A and 3B are cross sectional and overhead plan views illustrating a third test structure according to another exemplary embodiment of the present invention.

Third Exemplary Test Structure 316—FIGS. 3A and 3B
Name: The AA/P-N Junction and Isolation (STI) Region Test Structure.

FIGS. 3A and 3B show the third exemplary test structure 316. Corresponding analogous elements are shown as described above for first test structure 116. The corresponding elements are increased by 200, i.e. the 300 series. The corresponding elements are also changed from "first" to "third" as appropriate. FIG. 3B is a partial overhead view of FIG. 3A.

In third test structure 316, contact 334 contacts both third doped region 326 and isolation (STI) 320.

Third test structure 316 tests for leakage between the interface between Active Area 317 (and P-N junction 326, 318) and STI 320 using voltage contrast.

Contact plug 334 lands intentionally at the interface between STI 320 and Active Area 317. Typically the interface between Active Area 317 and STI 320 may have leakage. Any such leakage would also be worse at any STI divots. This third test structure 316 is useful for this assessment.

| 3rd test structure - element chart - FIGS. 3A and 3B | |
|---|---|
| number | Name |
| 316 | third test structure (site) |
| 316R | third test structure region |
| 312 | third test devices |
| 317 | a third Active Area |
| 311 | substrate |
| 320 | third isolation region |
| 318 | third well region |
| 326 | third doped region |
| 330 | dielectric layer (ILD layer) |
| 334 | a third contact (plug) |
| 336 | third conductive line |
| (Not shown) | 1$^{st}$ inter metal dielectric (IMD) layer |
| 336G | third conductive line (contacting the grounding (plug) 334G) |
| 314 | third grounding device |
| 319 | a third grounding Active Area |
| 318G | third grounding well region |
| 322 | third grounding doped region |
| 334G | a third grounding contact (plug) |

Figures 4A, 4B:
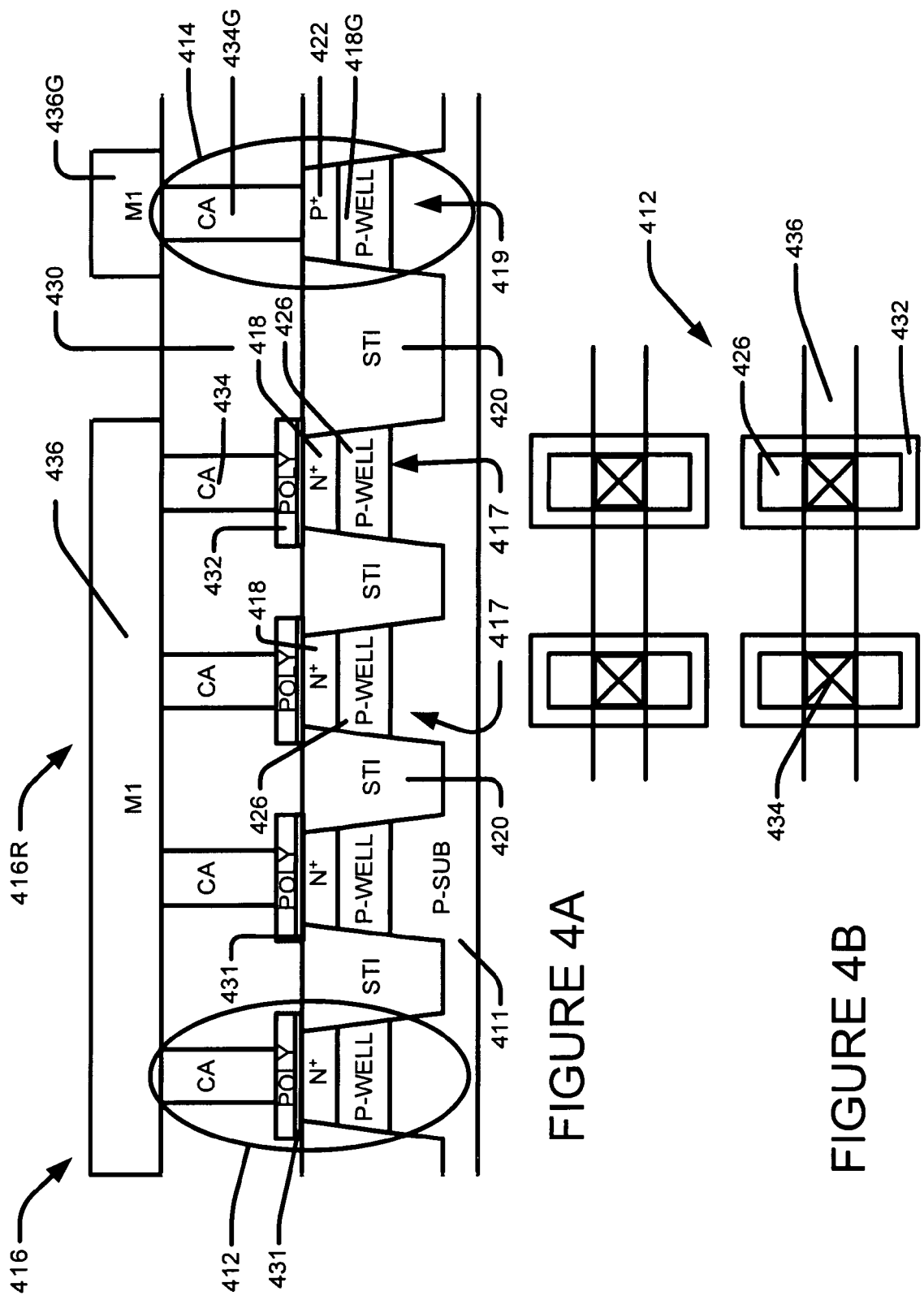
FIGS. 4A and 4B are cross sectional and overhead plan views illustrating a fourth test structure according to another exemplary embodiment of the present invention.

Fourth Exemplary Test Structure 416—FIGS. 4A and 4B

Name: The Gate Dielectric Leakage and Gate to Isolation Area to Ground Test Structure.

FIGS. 4A and 4B show the fourth exemplary test structure 416. Corresponding analogous elements are shown as described above for the first test structure. The corresponding elements are increased by 300, i.e. to the 400 series. The corresponding elements are also changed from "first" to "fourth" as appropriate.

In fourth test structure 416, contact 434 is to a fourth gate 432. Fourth gate 432 (e.g., poly pad) is over a gate dielectric 431 that is over fourth Active Area (AA) 417 and over fourth isolation regions (STIs) 420 on both sides. For example, see FIG. 4B which is a partial overhead view of FIG. 4A. Fourth test structure 416 tests gate dielectric 431 leakage to ground and gate 432/STI 420 to ground leakage using the EBI. It is noted that Active Area (AA) 417 may also include the P-N junction so that the P-N junction 418, 426 may also be a part of the leakage test.

| 4th test structure - element chart - FIGS. 4A and 4B | |
|---|---|
| number | Name |
| 416 | fourth test structure (site) |
| 416R | fourth test structure region |
| 412 | fourth test devices |
| 417 | a fourth Active Area |
| 411 | substrate |
| 420 | fourth isolation region |
| 418 | fourth well region |
| 426 | fourth doped region |
| 430 | dielectric layer (ILD layer) |
| 431 | (fourth) gate dielectric layer (gate oxide) |
| 432 | (fourth) gate |
| 434 | a fourth contact (plug) |
| 436 | fourth conductive line |
| (Not shown) | 1$^{st}$ inter metal dielectric (IMD) layer |
| 436G | fourth conductive line (contacting the grounding contact (plug) 434G) |
| 414 | fourth grounding device |
| 419 | a fourth grounding Active Area |
| 418G | fourth grounding well region |
| 422 | fourth grounding doped region |
| 434G | a fourth grounding contact (plug) |

The gate dielectric layer 431 (or in any analogous structure) may be comprised of, for example, silicon oxide or SiN or any high-k dielectric material.

Figures 5A, 5B:
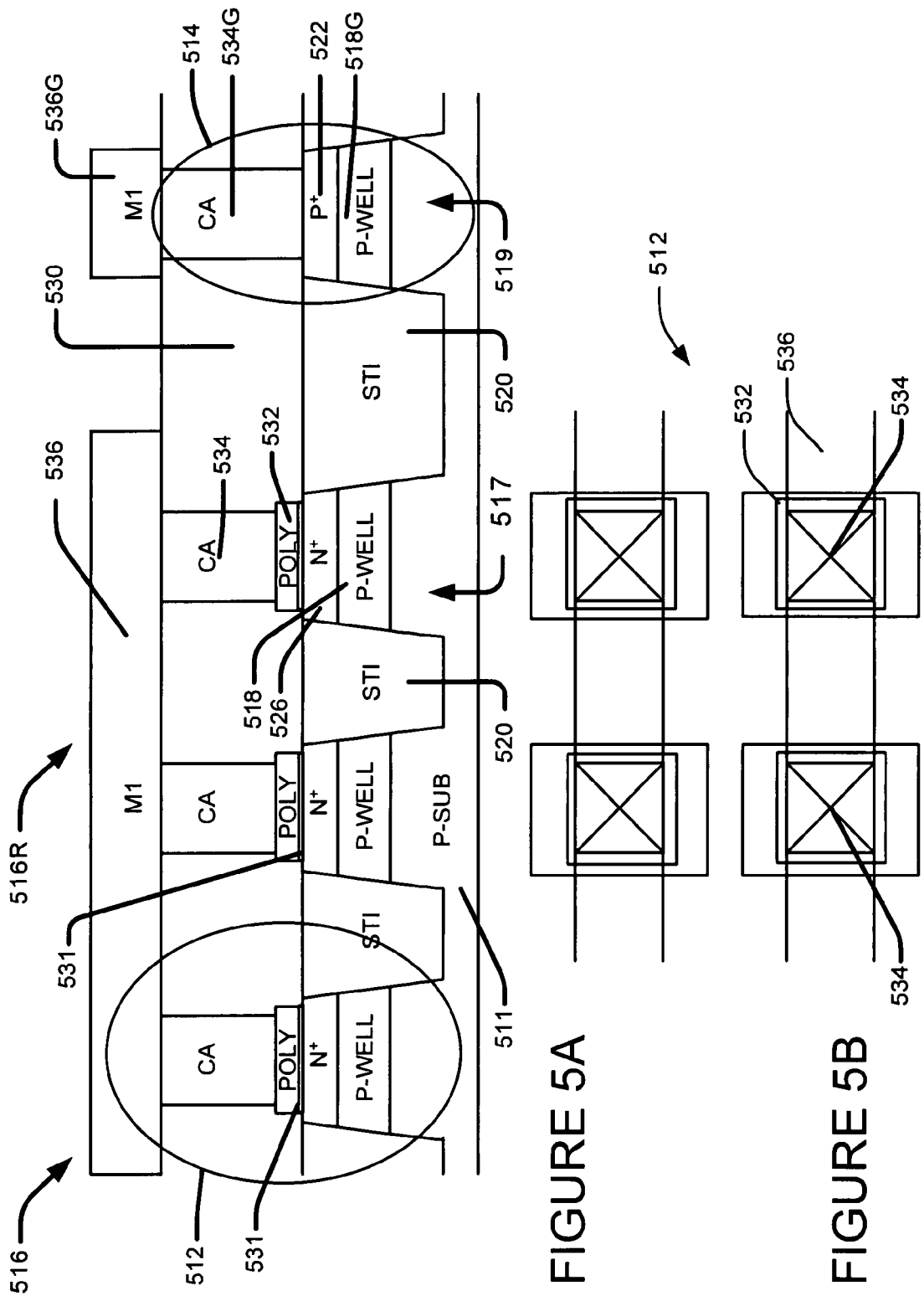
FIGS. 5A and 5B are cross sectional and overhead plan views illustrating a fifth test structure according to another exemplary embodiment of the present invention.

Fifth Exemplary Test Structure 516—FIGS. 5A and 5B

Name: The Gate Dielectric Leakage through AA/P-N Junction to Ground Test Structure.

FIGS. 5A and 5B show the fifth exemplary test structure 516. Corresponding analogous elements are shown as described above for the first test structure. The corresponding elements are increased by 400, i.e. to the 500 series. The corresponding elements are also changed from "first" to "fifth" as appropriate.

FIG. 5B is a partial overhead view of FIG. 5A.

In fifth test structure 516, contact 534 contacts fifth gate 532. Fifth gate 532 (e.g., poly pad) is over gate dielectric 531 that is over fifth Active Area (AA) 517. Fifth test structure 516 tests gate dielectric 531 leakage/thru AA 517 to ground leakage using the EBI, for example. Fifth gate 532 is not over STI 520.

| 5th test structure - element chart - FIGS. 5A and 5B | |
|---|---|
| number | Name |
| 516 | fifth test structure |
| 516R | fifth test structure region |
| 512 | fifth test devices |
| 517 | a fifth Active Area |
| 511 | substrate |
| 520 | fifth isolation region |
| 518 | fifth well region |
| 526 | fifth doped region |
| 530 | dielectric layer (ILD layer) |
| 531 | (fifth) gate dielectric layer (gate oxide) |
| 532 | (fifth) gate |
| 534 | a fifth contact (plug) |
| 536 | fifth conductive line |
| (not shown) | 1$^{st}$ inter metal dielectric (IMD) layer |
| 536G | fifth conductive line (contacting the grounding contact (plug) 534G) |
| 514 | fifth grounding device |
| 519 | a fifth grounding Active Area |
| 518G | fifth grounding well region |
| 522 | fifth grounding doped region |
| 534G | a fifth grounding contact (plug) |

Figures 6A, 6B:
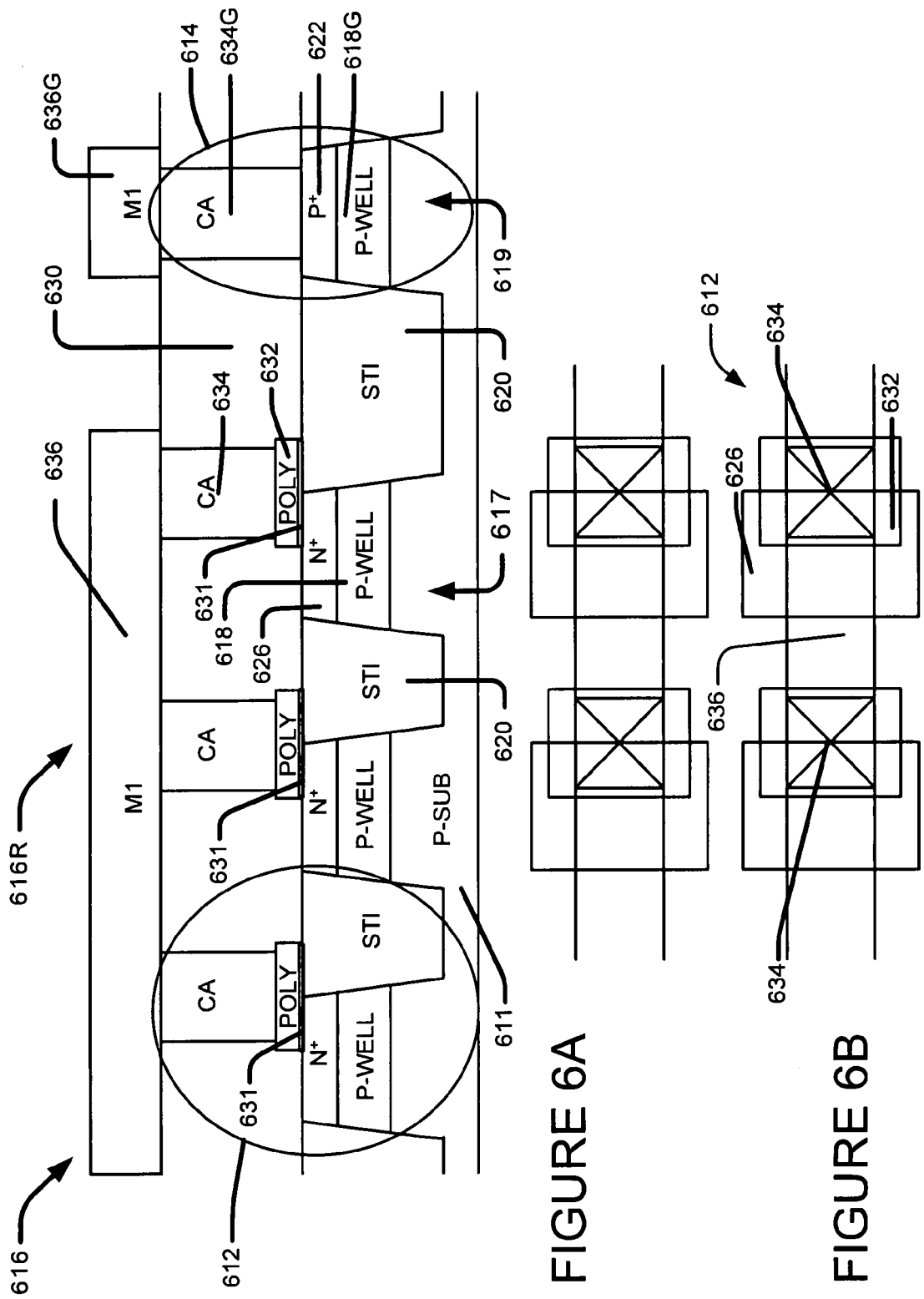
FIGS. 6A and 6B are cross sectional and overhead plan views illustrating a sixth test structure according to another exemplary embodiment of the present invention.

Sixth Exemplary Test Structure 616—FIGS. 6A and 6B

Name: The Gate Dielectric Leakage to Ground and Gate/One Side Isolation (STI) Region Leakage to Ground Test Structure.

Sixth test structure 616 is similar to the fourth test structure 416 but contact 634 of sixth test device 612 contacts sixth gate 632 over sixth gate dielectric layer 631 over a sixth isolation region (STI) 620 that only extends on one side of sixth Active Area 617 (not both sides of the AA 617 as in fourth test structure 416).

It is noted that the sixth test structure 616 and the fourth test structure 416 may test the same function, the only difference is probably the number of contact plugs 634/434 that are connected.

FIGS. 6A and 6B show the sixth exemplary test structure 616 with FIG. 6B being a partial overhead view of FIG. 6A. Corresponding analogous elements are shown as described above for first test structure 116. The corresponding elements are increased by 500, i.e. to the 600 series. The corresponding elements are also changed from "first" to "sixth" as appropriate.

In sixth test structure 616, contact 634 contacts sixth gate 632. Sixth gate 632 (e.g., poly pad) is over gate dielectric 631 that is over sixth Active Area (AA) 617 and over the adjacent sixth isolation region 620 on only one side. See FIG. 6B. Sixth test structure 616 tests gate dielectric 631 leakage to ground and gate 632/one side—isolation (STI) region 620 to ground leakage using the EBI, for example. It is noted that Active Area (AA) 617 may also include the P-N junction so that the P-N junction 626, 618 may also be a part of the leakage test.

The sixth test structure 616 is used to test for gate oxide 631 leakage and leakage at STI 620 and Si Active Area 617 interface.

| 6th test structure - element chart - FIGS. 6A and 6B | |
|---|---|
| number | Name |
| 616 | sixth test structure (site) |
| 616R | sixth test structure region |
| 612 | sixth test devices |
| 617 | a sixth Active Area |
| 611 | substrate |
| 620 | sixth isolation region |
| 618 | sixth well region |
| 626 | sixth doped region |
| 630 | dielectric layer (ILD layer) |
| 631 | (sixth) gate dielectric layer (gate oxide) |
| 632 | (sixth) gate |
| 634 | a sixth contact (plug) |
| 636 | sixth conductive line |
| (Not shown) | $1^{st}$ inter metal dielectric (IMD) layer |
| 636G | sixth conductive line (contacting the grounding contact (plug) 634G) |
| 614 | sixth grounding device |
| 619 | a sixth grounding Active Area |
| 618G | sixth grounding well region |
| 622 | sixth grounding doped region |
| 634G | a sixth grounding contact (plug) |

Seventh Exemplary Test Structure 716—FIGS. 7A and 7B
Name: The Oversized Gate Dielectric Leakage/AA/P-N junction to ground test structure.

FIGS. 7A and 7B show the seventh exemplary test structure 716. Corresponding elements are shown as described above for the first test structure 116 and the fifth test structure 516. The corresponding elements are increased by 600 (200 for the fifth test structure 5), i.e. to the 700 series. The corresponding elements are also changed from "first" ("fifth") to "seventh" as appropriate.

FIG. 7B is a partial overhead view of FIG. 7A.

The seventh test structure 716 is comparable to the fifth test structure 516 except that the surface area of the seventh doped region 726 is at least about 10% greater than the surface area of the fifth doped region 526 in the $5^{th}$ test structure 516 or the gate 732 (e.g. poly pad) in the $7^{th}$ test structure 716 is preferably between about 10 to 100 times larger than the gate 532 (e.g. poly pad) in the $5^{th}$ test structure 516. This is because gate oxide 731 leakage is proportional to the size (or area) of gate (e.g. poly pad) 732. By using the seventh test structure 716, any such leakage will be "magnified", so to speak, as compared to fifth test structure 516.

In seventh test structure 716, contact 734 contacts gate 732. Seventh gate 732 (e.g., poly pad) is over gate dielectric 731 that is over only seventh Active Area (AA) 717. Seventh test structure 716 tests gate dielectric 731 leakage/thru AA 717 to ground leakage using the EBI, for example. Gate 732/gate dielectric 731 is not over STI 720.

Figure 7C:
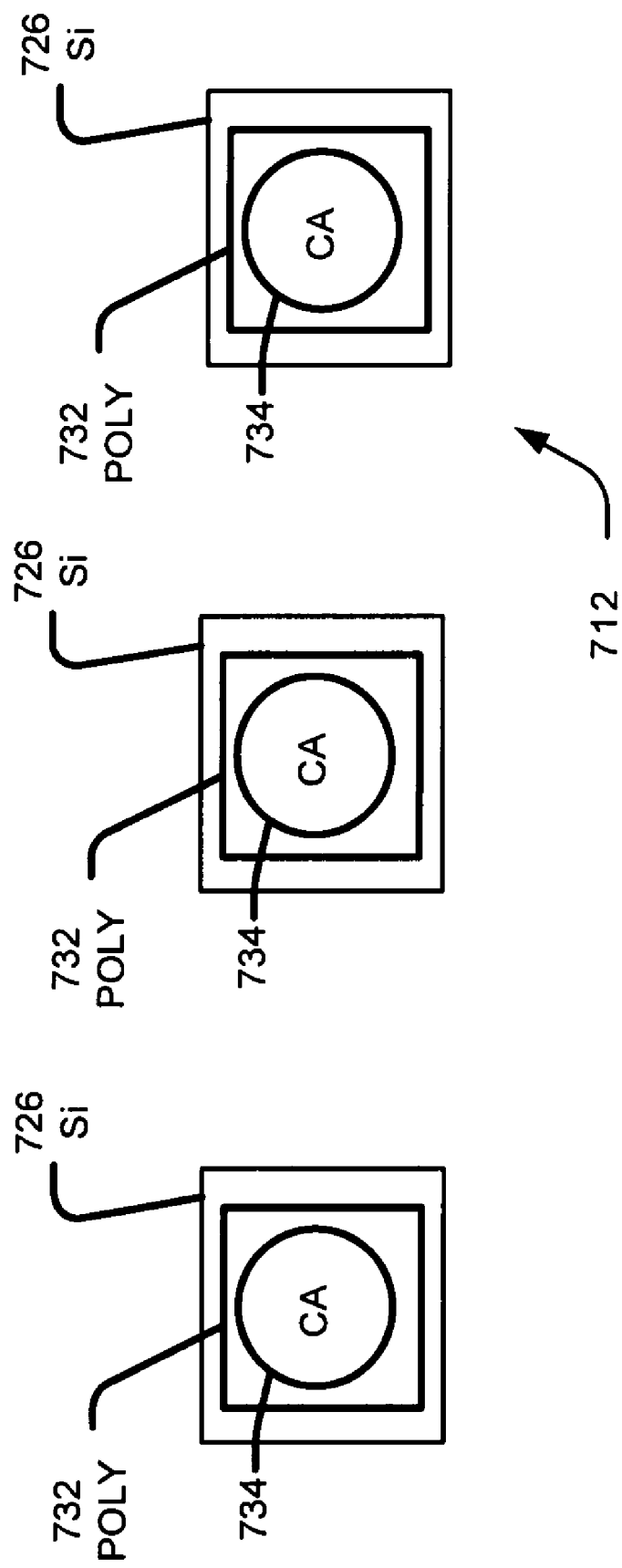

FIG. 7C shows another exemplary partial top down view of FIG. 7A.

| 7th test structure - element chart - FIGS. 7A and 7B | |
|---|---|
| number | Name |
| 716 | seventh test structure (site) |
| 716R | seventh test structure region |
| 712 | seventh test devices |
| 717 | a seventh Active Area |
| 711 | substrate |
| 720 | seventh isolation region |
| 718 | seventh well region |
| 726 | seventh doped region |
| 730 | dielectric layer (ILD layer) |
| 731 | (seventh) gate dielectric (gate oxide) |
| 732 | (seventh) gate |
| 734 | a seventh contact (plug) |
| 736 | seventh conductive line |
| (Not shown) | $1^{st}$ inter metal dielectric (IMD) layer |
| 736G | seventh conductive line (contacting the grounding contact (plug) 734G) |
| 714 | seventh grounding device |
| 719 | a seventh grounding Active Area |
| 718G | seventh grounding well region |
| 722 | seventh grounding doped region |
| 734G | a seventh grounding contact (plug) |

Eighth Exemplary Test Structure 816—FIGS. 8A and 8B
Name: The Active Area (AA)/P-N Junction Leakage and Gate Dielectric Leakage Structure.

FIGS. 8A and 8B show the exemplary eighth test structure 816 with FIG. 8B being a partial overhead view of FIG. 8A. Corresponding elements are shown as described above for the first test structure 116. The corresponding elements are increased by 700, i.e. to the 800 series. The corresponding elements are also changed from "first" to "eighth" as appropriate.

Eighth test structure 816 includes multiple eighth aligned test devices 812 and may include at least one misaligned test device 812M (the second test device from the left in FIG. 8A, for example).

The eighth aligned test devices 812 include contacts 834 that are adjacent to, but not contacting, respective eighth gates 832. Contacts 834 contact silicon (for example, N⁺ as shown in FIG. 8A) within Active Areas 817 (as do eighth gates 832/eighth gate dielectric 831—see below).

Eighth gates 832 (e.g., poly pads) are each over respective gate dielectrics 831 that are each over a portion of eighth Active Areas (AA) 817. Eighth test structure 816 tests gate dielectric 831 leakage/thru the AA/P-N junction to ground leakage using the EBI, for example.

In addition, the eighth test structure 816 may further include a misaligned eighth contact(s) 834M (M as in "misaligned" structure). Any eighth misaligned test device(s) 812M (the first structure on the left in FIG. 8A) includes contact 834M that is partially on gate (e.g. poly pad) 832M and partially directly on silicon (for example, N⁺ as shown in FIG. 8A) within Active Area 817M. Gate 832M is over gate dielectric 831M that in turn is on silicon (for example, N⁺ as shown in FIG. 8A) within Active Area 817M. Any eighth misaligned test device 812M tests the alignment of the eighth contact 834M. Also see FIG. 8C which is a partial overhead view of misaligned eighth contact 834M.

Preferably about 10% of the total eighth (aligned) test devices 812 may be misaligned eight test devices 812M. Contact resistance will be affected if any contact 834 is misaligned over its gate (poly pad) 832, this resistance change can be picked up by E-beam inspection and shown as Dark VC (voltage contrast).

8$^{th}$ test structure - element chart - FIGS. 8A and 8B

| number | Name |
| --- | --- |
| 816 | eighth test structure (site) |
| 816R | eighth test structure region |
| 812 | eighth test devices |
| 812M | optional misaligned eighth test device(s) |
| 817 | an eighth Active Area |
| 817M | optional misaligned eighth Active Area(s) |
| 811 | substrate |
| 820 | eighth isolation region |
| 818 | eighth well region |
| 826 | eighth doped region |
| 830 | dielectric layer (ILD layer) |
| 831 | (eighth) gate dielectric (gate oxide) |
| 831M | optional (eighth) gate dielectric (gate oxide) (under misaligned gate 832M) |
| 832 | (eighth) gate |
| 832M | optional (eighth) misaligned gate |
| 834 | an eighth contact (plug) |
| 834M | optional (eighth) misaligned contact (plug) |
| 836 | eighth conductive line |
| (Not shown) | 1$^{st}$ inter metal dielectric (IMD) layer |
| 836G | eighth conductive line (contacting the grounding contact (plug) 834G) |
| 814 | eighth grounding device |
| 819 | an eighth grounding Active Area |
| 818G | eighth grounding well region |
| 822 | eighth grounding doped region |
| 834G | an eighth grounding contact (plug) |

Exemplary E-Beam Inspection Tools and E-Beam Inspection Types

Exemplary E-beam inspection systems may be, for example, the eScan300/380 by Hermes Microvision, Inc. (HMI), CA, USA, or the eS3x EBI by KLA-Tencor, CA, USA.

A preferred E-beam inspection is the voltage contrast defect detection.

Electrical Tests Types

Exemplary electrical test tools may include, for example, the model TEL (AGILEAT) P12XL. Other commercially available E-testers may also be acceptable.

An example of an electrical test performed is a current leakage measurement.

After the test structures (116, 216, 316 . . . 816, for example) are tested using VC techniques, they may be further tested using electrical tests. Preferably, we first form a first level metal layer (M1) contacting said contacts before conducting any electrical tests.

We may also electrically test (ET) all of the test structures (116, 216, 316 . . . 816) present to obtain electrical test results concurrently with the VC technique testing. The electrical testing permits failure sites to be found that may not have been detected during the EBI (Electron Beam Inspection) testing.

Next we correlate the electrical test (ET) results and the voltage contrast (VC) test results to determine which elements of the test structures (116, 216, 316 . . . 816) are defective. For example, if both the electric test and VC test for a test site is bad, then that element (e.g., gate oxide) tested is confirmed bad.

These test structures 116, 216, 316 . . . 816, for example, may be located anywhere on the wafer including the kerf. The reason is because since each of the test structure are small in size, the test structures may be increased by cascade or repeat the similar structure in array form.

Example Test Methods

By testing the test structures 116, 216, 316 . . . 816, for example, we are able to help identify and isolate electrical leakage issues related to isolation region (STI) defects, Active Area defects, gate oxide defects, etc. One main advantage of the eight exemplary test structures disclosed herein are that the test structures 116, 216, 316 . . . 816, for example, enable us to decouple the isolation region (STI) defects, Active Area defects, and gate oxide defects, for example, and make it easier to verify leakage issues at each of the test structures 116, 216, 316 . . . 816 independently. All these test structures 116, 216, 316 . . . 816 can be inspected on E-beam inspection systems (IBS) (e.g., an eScan300/380 or an eS31/32 . . . etc).

We can decouple and isolate each of the defects by inspecting more or all of the different test structures 116, 216, 316 . . . 816, for example, on the same wafer.

EXAMPLE

Test structure #1 (116) can detect both Si and STI defects because contact plug 134 is dropped on (contacting) active region 117.

Test structure #2 (216) can detect STI defects only because contact plug 324 is only dropped on (contacting) STI region 220.

One key point may be that we can isolate each module (e.g., Si defect or STI leakage) by inspecting all of the different test structures 116, 216, 316 . . . 816 on the same wafer. Conclusions may be drawn by analyzing all of the test structure inspection results together.

For example, if both test structures #1 (116) and #2 (216) on the same wafer are inspected and measured, we can conclude leakage is dominated by each region.

Example 1

Test Structure #1 (116)—High count of BVC
Test Structure #2 (216)—Low count of BVC
leakage must be due to Si defect, as test structure #2 (216) (sensitive for STI 220 leakage) has a low count of BVC.

Example 2

Test Structure #1 (116)—Low count of BVC
Test Structure #2 (216)—High count of BVC
leakage could be from STI as test structure #2 (216) is more sensitive to STI 220 leakage and test structure #1 (116) is more sensitive to Si leakage.

If both test structures #1 (116) and #2 (216) have high counts of BVC it is reasonable to suspect we have both Si and STI leakage issues. However we can draw better conclusions by looking at the rest of the test structures #3 (316) . . . #8 (816) and isolate each of the regions, if any, that have potential problem.

Non-Limiting Exemplary Embodiments

The exemplary embodiment test structures 116, 216, 316 . . . 816, for example, can be used on a product wafer or on a monitor wafer. The test structures 116, 216, 316 . . . 816 may be formed in the kerf area between chips on a wafer, for example.

It is noted that 1 or more, 2 or more, 3 or more, 4 or more, 5 or more, 6 or more, 7 or more or 8 or more different test structures 116, 216, 316 . . . 816 may be employed. Additionally, more than one of the same test structure may also be employed, for example a first 116, fifth 516 and two sixth 616 test structures may be employed.

Given the variety of embodiments of the present invention just described, the above description and illustrations shown not be taken as limiting the scope of the present invention defined by the claims.

While the invention has been particularly shown and described with reference to the example embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of forming a device comprising:
   providing a test structure on a substrate which detects various types of leakage defects,
   the test structure capable of quantifying magnitude of leakage based on grey scale;
   differentiating killer leakage defects comprising,
   forming a first level metal contacting contacts coupled to the test structure;
   performing a voltage contrast (VC) test by scanning the test structure to obtain a VC test result, wherein the VC test is performed prior to forming the first level metal;
   performing an electrical test on the test structure to obtain an electrical test result after forming the first level metal, and
   correlating the electrical test results and VC test results to determine which elements of the test structure are defective;
   determining a solution for the killer defects; and
   fabricating the device on the substrate incorporating the solution.

2. The method of claim 1 wherein the test structure comprises of at least two different structures, wherein the test structures exhibit a discernable defect characteristic upon being scanned by the VC test.

3. The method of claim 2 wherein the at least two different test structures further comprise specific structures designed to permit exclusion of one or more possible structural defects from the discernable defect characteristic.

4. The method of claim 2 wherein the at least two different test structures are selected from a plurality of test structures.

5. The method of claim 2 wherein the at least two different test structures are selected from the following structures:
   a first test structure having an Active Area (AA)/P-N junction leakage test structure;
   a second test structure having an isolation region to ground test structure;
   a third test structure having an AA/P-N junction and isolation region test structure;
   a fourth test structure having a gate dielectric leakage and gate to isolation region to ground test structure;
   a fifth test structure having a gate dielectric leakage through AA/P-N junction to ground leakage test structure;
   a sixth test structure having a gate dielectric to ground and gate/one side isolation region leakage to ground test structure;
   a seventh test structure having an oversized gate dielectric through AA/P-N junction to ground leakage test structure; or
   an eighth test structure having an AA/P-N junction leakage gate dielectric leakage test structure.

6. The method of claim 2 wherein the at least two different test structures comprise:
   an Active Area (AA)/P-N junction leakage test structure;
   an isolation region to ground test structure; or
   a combination thereof.

7. The method of claim 1 wherein the test structure is provided in a test site which includes at least two different test structures selected from a plurality of test structures.

8. The method of claim 1 wherein the test structure is provided in a test site which includes at least two different test structures selected from the following structures:
   a first test structure having an Active Area (AA)/P-N junction leakage test structure;
   a second test structure having an isolation region to ground test structure;
   a third test structure having an AA/P-N junction and isolation region test structure;
   a fourth test structure having a gate dielectric leakage and gate to isolation region to ground test structure;
   a fifth test structure having a gate dielectric leakage through AA/P-N junction to ground leakage test structure;
   a sixth test structure having a gate dielectric to ground and gate/one side isolation region leakage to ground test structure;
   a seventh test structure having an oversized gate dielectric through AA/P-N junction to ground leakage test structure; or
   an eighth test structure having an AA/P-N junction leakage gate dielectric leakage test structure.

9. The method of claim 8 wherein at least one of the test structures includes a first level metal test structure.

10. The method of claim 8 wherein at least one of the test structures comprises a grounding device.

11. The method of claim 1 comprises scanning the test structures to determine the grey scale.

12. The method of claim 1 wherein
   the VC test is performed after forming the contacts and
   wherein the test structure includes a grounding device.

13. The method of claim 1 wherein
   the VC test is performed after forming the contacts.

14. The method of claim 1 wherein the test structures comprises:
   an Active Area (AA)/P-N junction leakage test structure;
   an isolation region to ground test structure; or
   a combination thereof.

15. A method of forming a device comprising:
   providing a test structure on a substrate which detects various types of leakage defects, the test structure capable of quantifying magnitude of leakage based on grey scale;
   differentiating killer leakage defects comprising,
   forming a first level metal contacting contacts coupled to the test structure;
   performing a voltage contrast (VC) test by scanning the test structure to obtain VC test results, wherein the VC test is performed prior to forming the first level metal;
   performing an electrical test on the test structure to obtain electrical test results after forming the first level metal, and correlating the electrical test results and VC test results to determine which elements of the test structure are defective;

determining a solution for the killer defects; and fabricating the device incorporating the solution, wherein the device is fabricated on a wafer comprising a plurality of devices.

16. The method of claim 15 wherein the test structure comprises of at least two different test structures, wherein each of the test structures exhibit a discernable defect characteristic upon voltage contrast (VC) scanning when any test structure that exhibits the discernable defect characteristic has at least one predetermined structural defect.

17. The method of claim 16 wherein the at least two different test structures further comprise specific structures designed to permit exclusion of one or more possible structural defects from the discernable defect characteristic.

18. The method of claim 15 comprises scanning the test structures to determine the grey scale.

19. The method of claim 15 wherein performing the VC test is performed after forming the contacts.

20. A method of forming a device comprising:

providing a test structure on a substrate which detects various types of leakage defects, the test structure capable of quantifying magnitude of leakage based on grey scale, wherein the test structure comprises at least two test structures selected from a plurality of test structures;

differentiating killer leakage defects comprising, forming a first level metal contacting contacts coupled to the test structure;

performing a voltage contrast (VC) test by scanning the test structure to obtain a VC test result, wherein the VC test is performed prior to forming the first level metal;

performing an electrical test on the test structure to obtain a second test result after forming the first level metal, and correlating the VC and electrical test results to determine which elements of the test structure are defective;

determining a solution for the killer defects; and fabricating the device incorporating the solution, wherein the device is fabricated on a wafer comprising a plurality of devices.

* * * * *